United States Patent
Sasaki

(10) Patent No.: US 10,559,533 B2
(45) Date of Patent: Feb. 11, 2020

(54) SEMICONDUCTOR DEVICE AND METHOD OF MANUFACTURING THE SAME

(71) Applicant: TOSHIBA MEMORY CORPORATION, Minato-ku (JP)

(72) Inventor: Toshiyuki Sasaki, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/888,348

(22) Filed: Feb. 5, 2018

(65) Prior Publication Data

US 2019/0074249 A1  Mar. 7, 2019

(30) Foreign Application Priority Data

Sep. 7, 2017 (JP) .................. 2017-172166

(51) Int. Cl.
| | |
|---|---|
| H01L 27/115 | (2017.01) |
| H01L 23/535 | (2006.01) |
| H01L 27/11582 | (2017.01) |
| H01L 21/768 | (2006.01) |
| H01L 27/11565 | (2017.01) |
| H01L 27/11568 | (2017.01) |
| H01L 27/11556 | (2017.01) |

(52) U.S. Cl.
CPC ...... *H01L 23/535* (2013.01); *H01L 21/76816* (2013.01); *H01L 21/76877* (2013.01); *H01L 27/11556* (2013.01); *H01L 27/11565* (2013.01); *H01L 27/11568* (2013.01); *H01L 27/11582* (2013.01)

(58) Field of Classification Search
CPC ......... H01L 27/11568; H01L 27/11582; H01L 27/11565; H01L 27/1157; H01L 27/11575; H01L 23/5283; H01L 27/11556; H01L 21/76816; H01L 21/76877; H01L 23/535
See application file for complete search history.

(56) References Cited

U.S. PATENT DOCUMENTS

| | | | | |
|---|---|---|---|---|
| 7,855,457 | B2* | 12/2010 | Mizukami | ........... H01L 23/5226 257/758 |
| 8,383,512 | B2 | 2/2013 | Chen et al. | |
| 8,541,831 | B2* | 9/2013 | Chae | ................. H01L 27/11578 257/324 |

(Continued)

FOREIGN PATENT DOCUMENTS

| | | |
|---|---|---|
| JP | 2009-16400 | 1/2009 |
| JP | 2012-244180 | 12/2012 |

(Continued)

*Primary Examiner* — Savitri Mulpuri
(74) *Attorney, Agent, or Firm* — Oblon, McClelland, Maier & Neustadt, L.L.P.

(57) ABSTRACT

In one embodiment, a method of manufacturing a semiconductor device includes forming a stacked body that alternately includes a plurality of first films and a plurality of second films on a substrate. The method further includes performing a first process of forming $N^2$ holes having N kinds of depths in the stacked body where N is an integer of three or more. The method further includes performing a second process of processing the $N^2$ holes so as to have $N^2$ kinds of depths after performing the first process.

7 Claims, 28 Drawing Sheets

(56) References Cited

U.S. PATENT DOCUMENTS

| | | | | |
|---|---|---|---|---|
| 8,633,099 | B1* | 1/2014 | Shih | H01L 21/76805 |
| | | | | 438/598 |
| 8,728,889 | B2* | 5/2014 | Lee | H01L 21/76802 |
| | | | | 438/257 |
| 9,076,502 | B2 | 7/2015 | Nakajima | |
| 9,478,546 | B2* | 10/2016 | Yang | H01L 27/11548 |
| 9,773,804 | B2* | 9/2017 | Lee | H01L 27/11582 |
| 9,786,680 | B2* | 10/2017 | Shimizu | H01L 27/11568 |
| 9,871,054 | B2* | 1/2018 | Imamura | H01L 27/11582 |
| 9,935,123 | B2* | 4/2018 | Nishikawa | H01L 23/528 |
| 10,153,176 | B2* | 12/2018 | Soda | H01L 27/11582 |
| 2016/0111429 | A1 | 4/2016 | Yang | |
| 2018/0090511 | A1* | 3/2018 | Nakajima | H01L 27/1157 |

FOREIGN PATENT DOCUMENTS

| | | |
|---|---|---|
| JP | 2015-28989 | 2/2015 |
| JP | 5801782 | 10/2015 |
| JP | 2016-82211 | 5/2016 |

\* cited by examiner

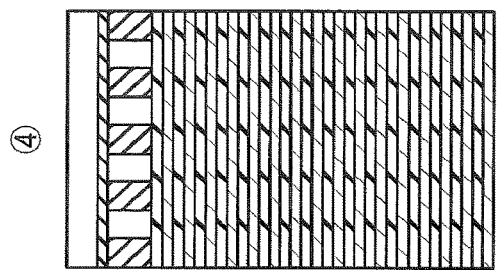
FIG. 12D
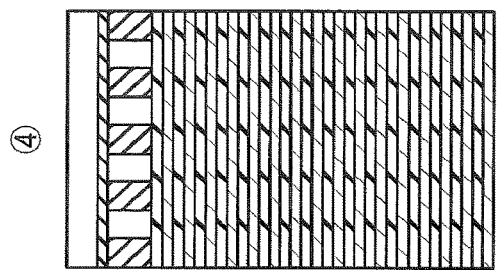
FIG. 12C
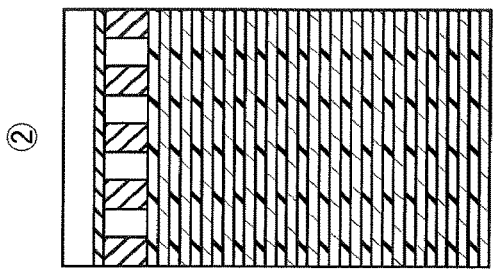
FIG. 12B
FIG. 12A
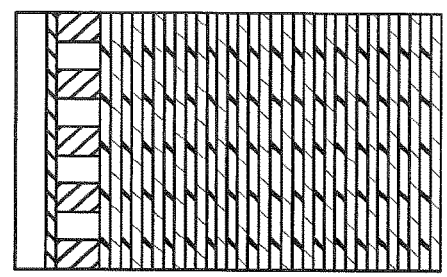
FIG. 12H
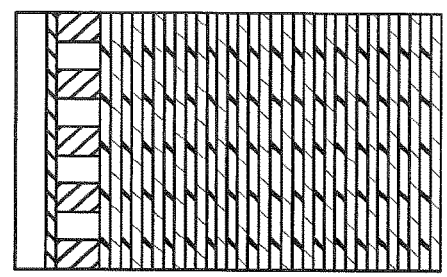
FIG. 12G
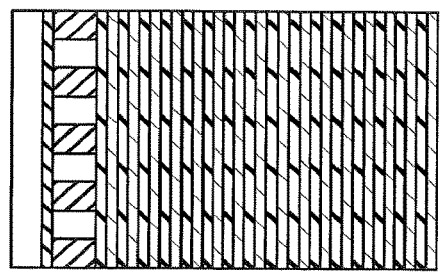
FIG. 12F
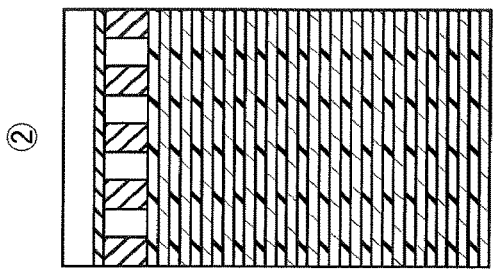
FIG. 12E

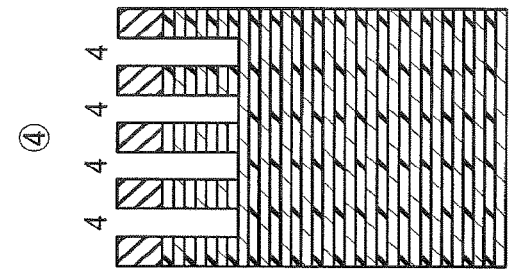
FIG. 16D
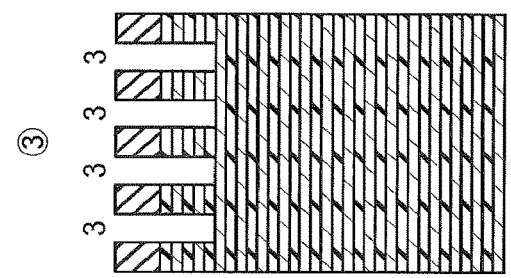
FIG. 16C
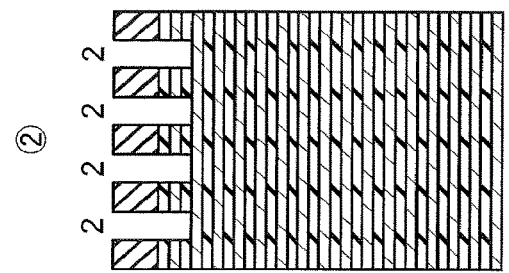
FIG. 16B
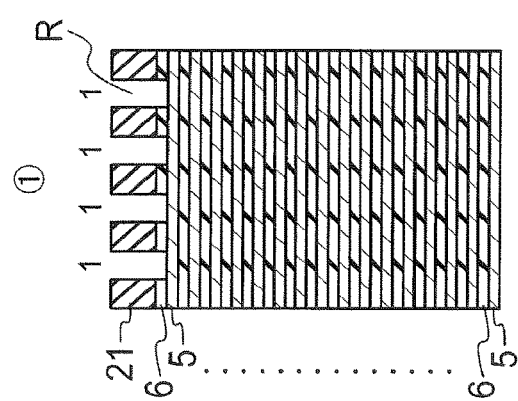
FIG. 16A
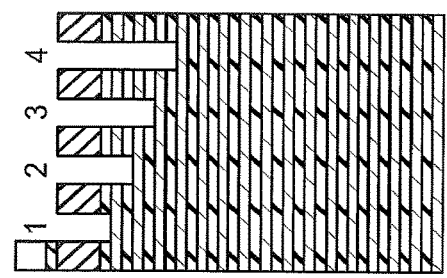
FIG. 16H
FIG. 16G
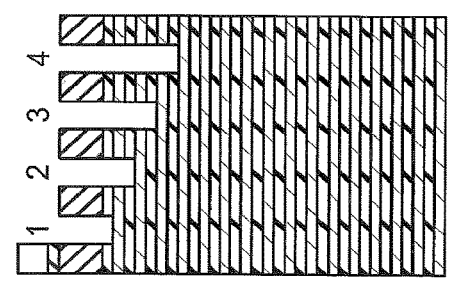
FIG. 16F
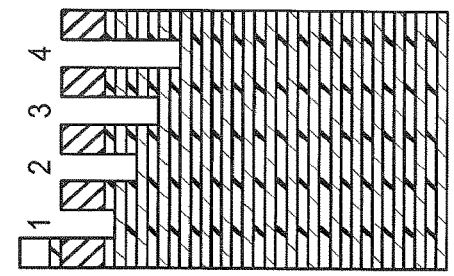
FIG. 16E

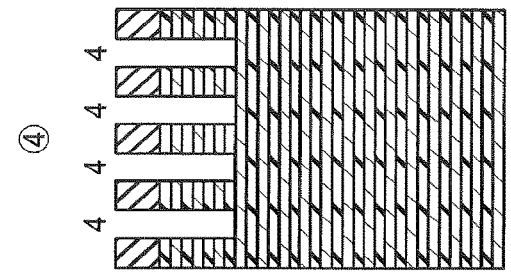
FIG. 17D
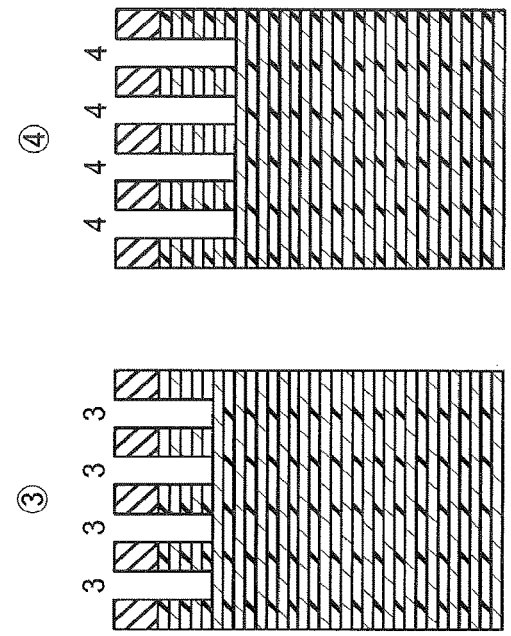
FIG. 17A FIG. 17B FIG. 17C
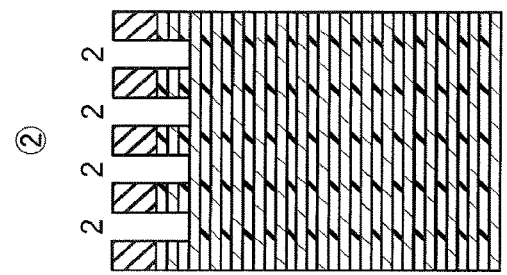
FIG. 17E
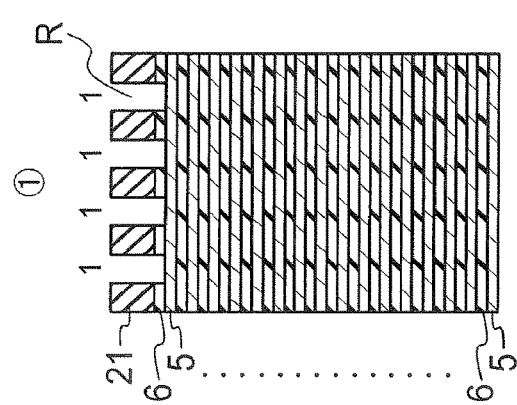
FIG. 17E FIG. 17F
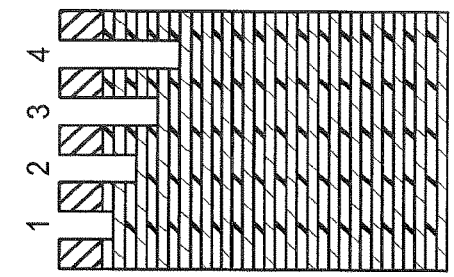
FIG. 17H
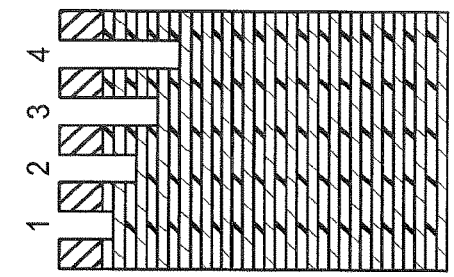
FIG. 17G
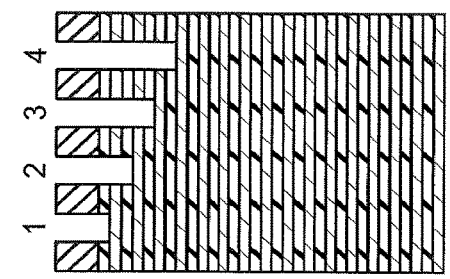
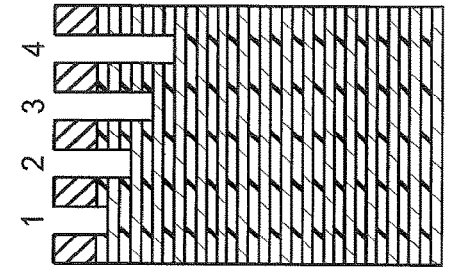

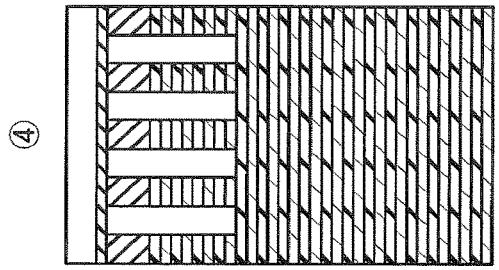
FIG. 18A
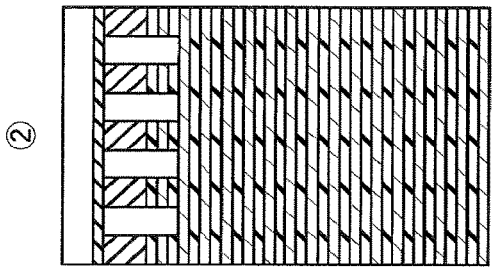
FIG. 18E
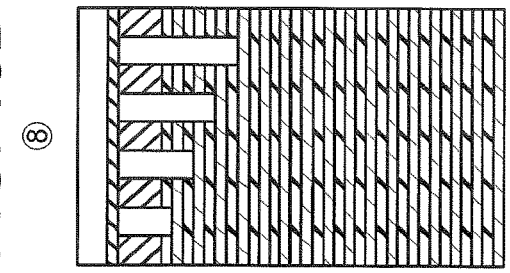
FIG. 18B
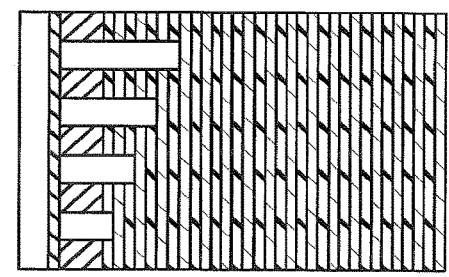
FIG. 18F
FIG. 18C
FIG. 18G
FIG. 18D
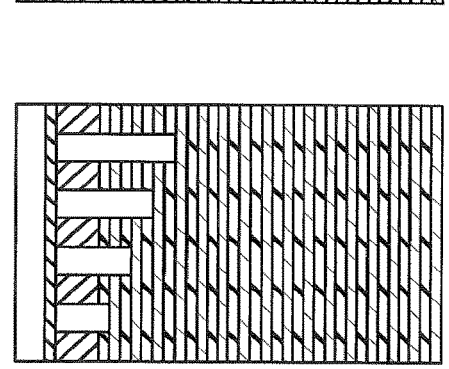
FIG. 18H

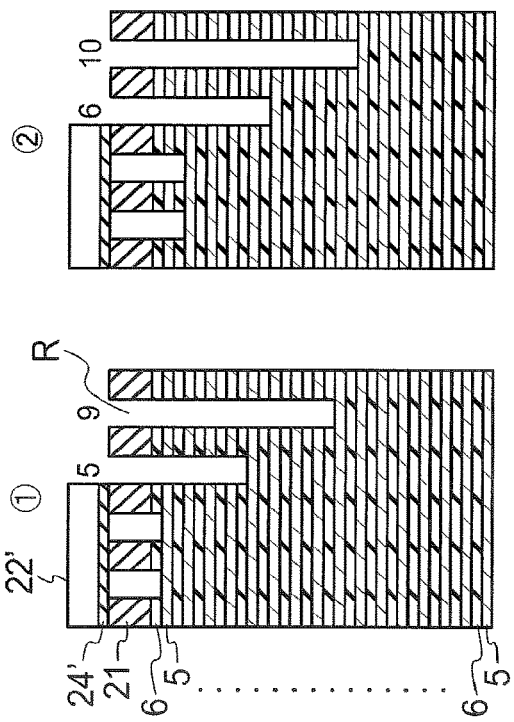
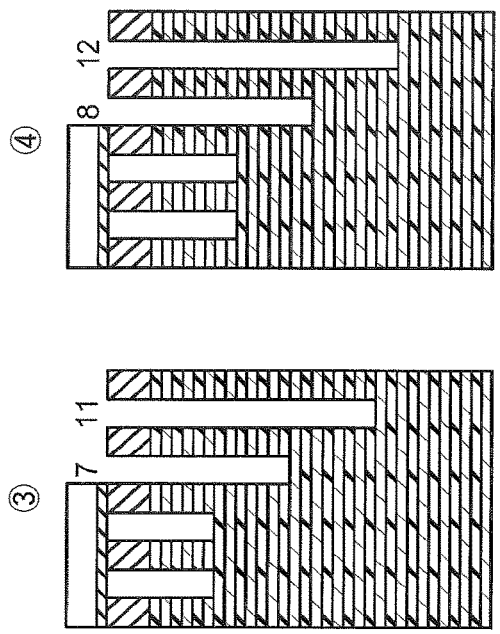
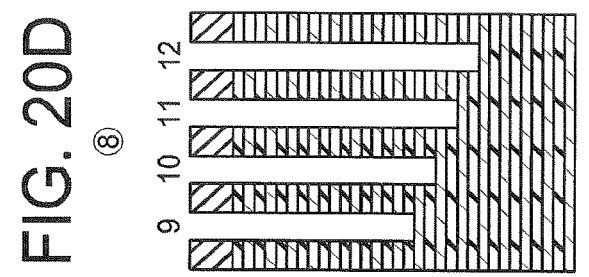
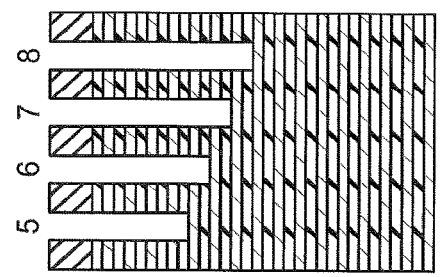
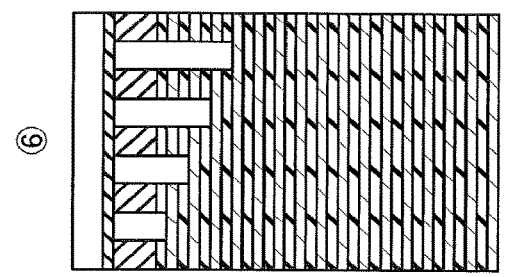
FIG. 20A FIG. 20B FIG. 20C FIG. 20D
FIG. 20E FIG. 20F FIG. 20G FIG. 20H

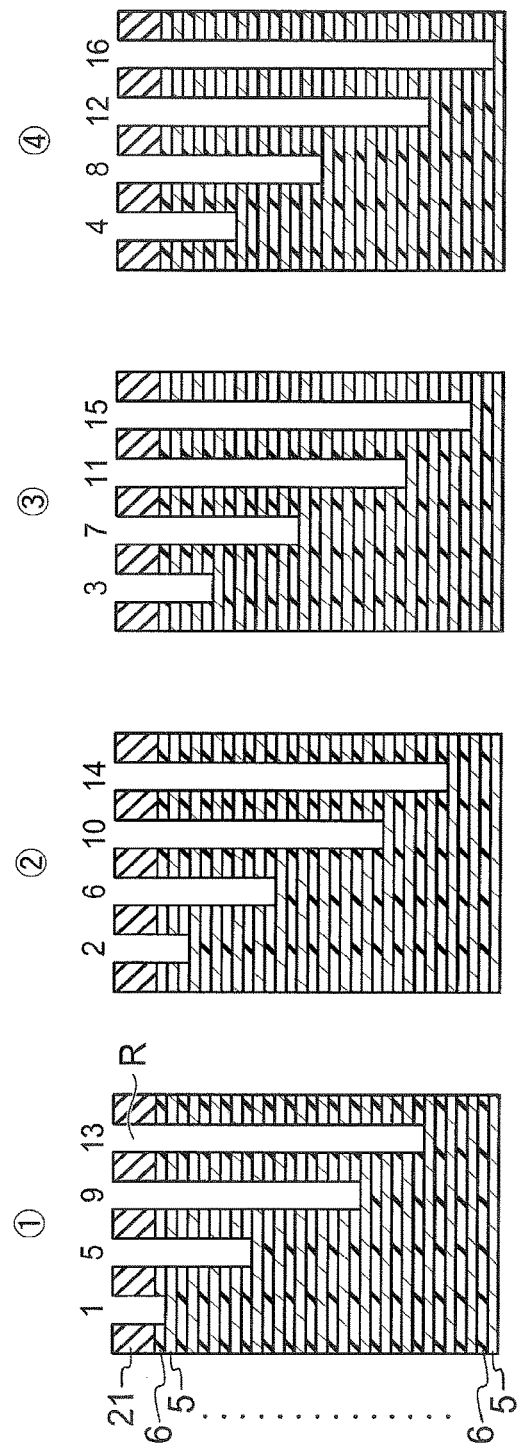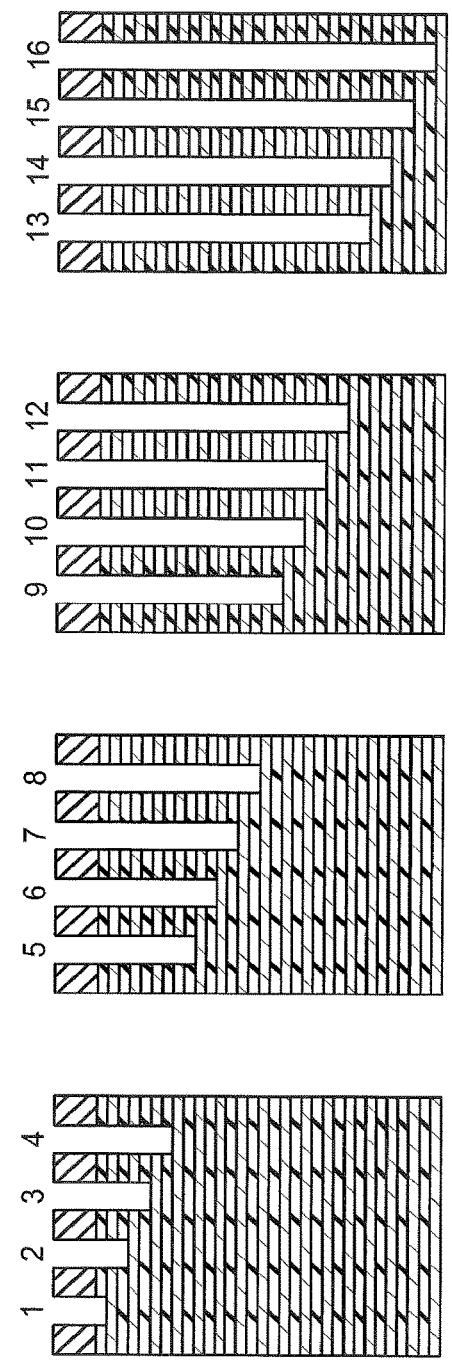
FIG. 22A, FIG. 22B, FIG. 22C, FIG. 22D, FIG. 22E, FIG. 22F, FIG. 22G, FIG. 22H

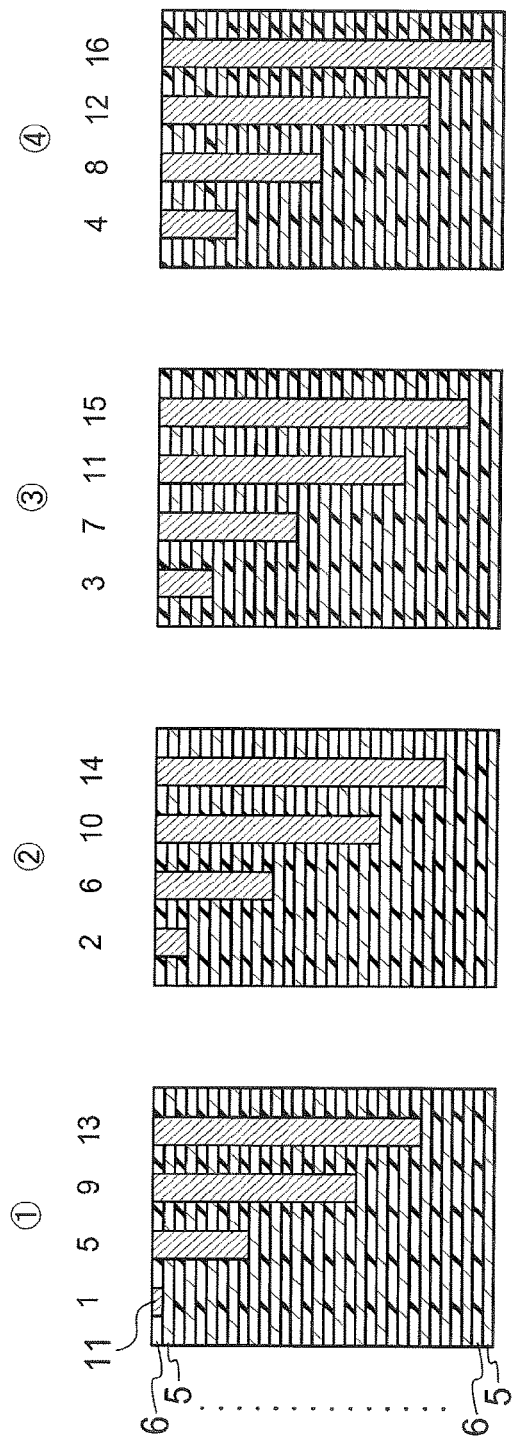
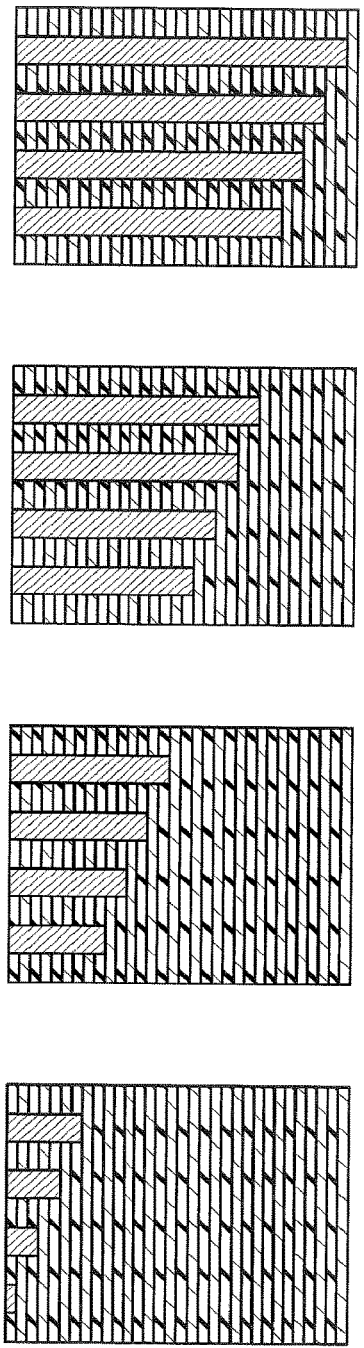
FIG. 23A FIG. 23B FIG. 23C FIG. 23D FIG. 23E FIG. 23F FIG. 23G FIG. 23H

US 10,559,533 B2

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2017-172166, filed on Sep. 7, 2017, the entire contents of which are incorporated herein by reference.

FIELD

Embodiments described herein relate to a semiconductor device and a method of manufacturing the same.

BACKGROUND

In recent years, contact holes with various depths have been often formed in a case of manufacturing a three-dimensional semiconductor memory or the like. In such a case, the number of steps for forming these contact holes become large, which causes a problem that increases costs and loads for manufacturing the three-dimensional semiconductor memory.

BRIEF DESCRIPTION OF THE DRAWINGS

FIGS. 11A to 23H are cross-sectional views showing the details of the method of manufacturing the semiconductor device of the first embodiment;

DETAILED DESCRIPTION

Embodiments will now be explained with reference to the accompanying drawings.

In one embodiment, a method of manufacturing a semiconductor device includes forming a stacked body that alternately includes a plurality of first films and a plurality of second films on a substrate. The method further includes performing a first process of forming $N^2$ holes having N kinds of depths in the stacked body where N is an integer of three or more. The method further includes performing a second process of processing the $N^2$ holes so as to have $N^2$ kinds of depths after performing the first process.

First Embodiment

Figure 1:
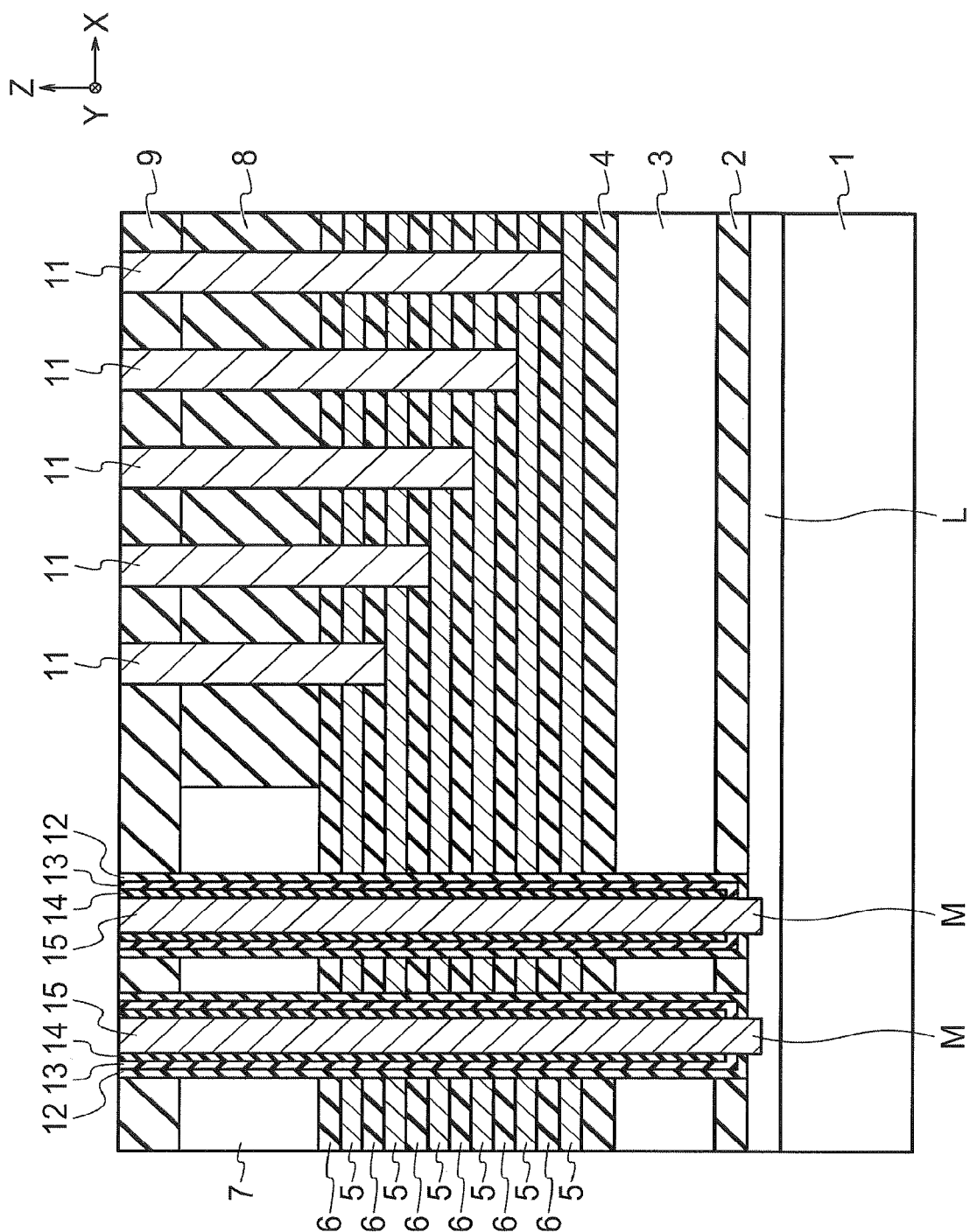
FIG. 1 is a cross-sectional view showing a structure of a semiconductor device of a first embodiment.

FIG. 1 is a cross-sectional view showing a structure of a semiconductor device of a first embodiment. The semiconductor device in FIG. 1 includes a three-dimensional semiconductor memory.

The semiconductor device in FIG. 1 includes a substrate 1, a first insulator 2, a source-side conductive layer 3, a second insulator 4, a plurality of electrode layers 5 which are exemplarily first films, a plurality of insulating layers 6 which are exemplarily second films, a drain-side conductive layer 7, a first inter layer dielectric 8, a second inter layer dielectric 9, a plurality of contact plugs 11, first memory insulators 12, charge storage layers 13, second memory insulators 14, and channel semiconductor layers 15.

The substrate 1 is exemplarily a semiconductor substrate such as a silicon substrate. FIG. 1 shows an X-direction and a Y-direction which are parallel to a surface of the substrate 1 and perpendicular to each other, and a Z-direction perpendicular to the surface of the substrate 1. In the specification, a +Z-direction is handled as an upward direction, and a −Z-direction is handled as a downward direction. The −Z-direction may coincide with the direction of gravity or may not coincide with the direction of gravity.

The first insulator 2 is formed on a diffusion layer L formed in the substrate 1. The source-side conductive layer 3 is formed on the first insulator 2. The second insulator 4 is formed on the source-side conductive layer 3.

The plurality of electrode layers 5 and the plurality of insulating layers 6 are alternately stacked on the second insulator 4. The electrode layer 5 is, for example, a metal layer and functions as a word line or a selection line. The number of the electrode layers 5 is, for example, 48 or more. The insulating layer 6 is, for example, a silicon oxide film. The number of the insulating layers 6 is, for example, 48 or more.

The drain-side conductive layer 7 and the first inter layer dielectric 8 are formed on a stacked body including these electrode layers 5 and insulating layers 6. The second inter layer dielectric 9 is formed on the drain-side conductive layer 7 and the first inter layer dielectric 8.

The plurality of contact plugs 11 are formed in contact holes which penetrate a part of the electrode layers 5 and the insulating layers 6, the first inter layer dielectric 8, and the second inter layer dielectric 9. These contact plugs 11 are electrically connected to the electrode layers 5 different from one another. Each contact plug 11 is formed, for example, of a barrier metal layer such as a titanium-containing layer, and a plug material layer such as a tungsten layer.

In the present embodiment, in order to prevent a lateral face of the contact plug 11 and a lateral face of the electrode layer 5 from coming into contact with each other, a not-shown insulator is formed between the lateral face of the contact plug 11 and the lateral face of the electrode layer 5. Meanwhile, a lower face of each contact plug 11 is in contact with an upper face of the corresponding electrode layer 5.

The first memory insulator 12, the charge storage layer 13 and the second memory insulator 14 are sequentially formed on a lateral face of a memory hole M which penetrates the first insulator 2, the source-side conductive layer 3, the second insulator 4, the electrode layers 5, the insulating layers 6, the drain-side conductive layer 7 and the second inter layer dielectric 9. The channel semiconductor layer 15 is formed in the memory hole M via the first memory insulator 12, the charge storage layer 13 and the second memory insulator 14, and is electrically connected to the substrate 1.

The first memory insulator 12 is, for example, a silicon oxide film. The charge storage layer 13 is, for example, a silicon nitride film. The second memory insulator 14 is, for example, a silicon oxide film. The channel semiconductor layer 15 is, for example, a polysilicon layer. The charge storage layer 13 may be a semiconductor layer such as a polysilicon layer.

These are formed, for example, by sequentially forming the first memory insulator 12, the charge storage layer 13 and the second memory insulator 14 on the lateral face and a bottom face of the memory hole M, removing the second memory insulator 14, the charge storage layer 13 and the first memory insulator 12 from the bottom face of the memory hole M, and after that, embedding the channel semiconductor layer 15 in the memory hole M.

FIGS. 2A to 3B are cross-sectional views showing a method of manufacturing a semiconductor device of a comparative example of the first embodiment, and show steps of forming the contact plugs 11. Signs Tp represent peripheral transistors formed on the substrate 1.

Figure 2A:
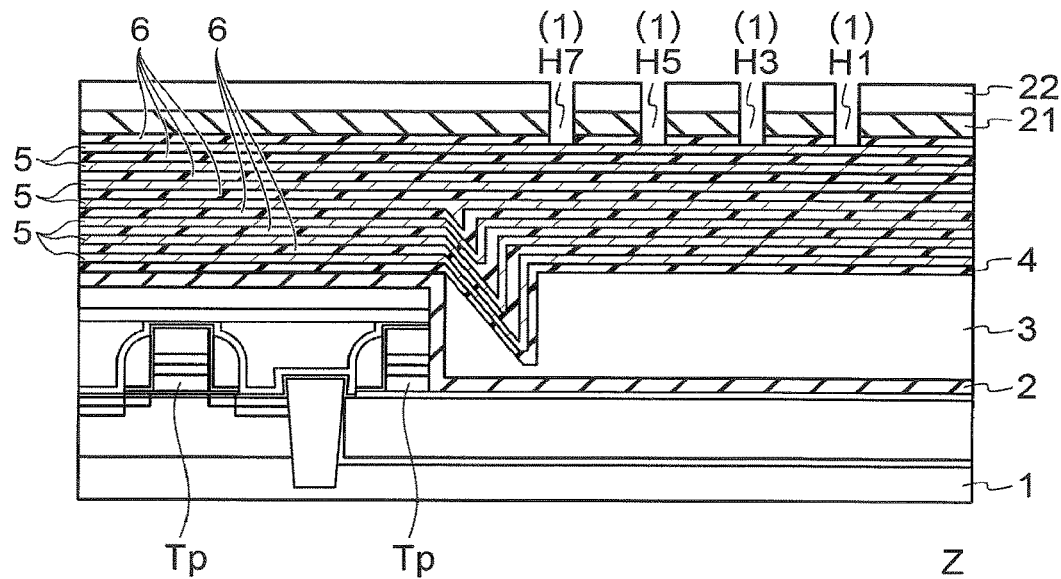
FIGS. 2A to 3B are cross-sectional views showing a method of manufacturing a semiconductor device of a comparative example of the first embodiment.

First, on the substrate 1, the first insulator 2, the source-side conductive layer 3, the second insulator 4 and the like are formed, and the plurality of electrode layers 5 and the plurality of insulating layers 6 are alternately formed on the second insulator 4 (FIG. 2A). Next, on a stacked body of the electrode layers 5 and the insulating layers 6, the drain-side conductive layer 7, the first inter layer dielectric 8 and the second inter layer dielectric 9 which are not shown are formed, and a hard mask layer 21 and a resist film 22 are sequentially formed on the second inter layer dielectric 9 (FIG. 2A). The hard mask layer 21 is, for example, a silicon nitride film or a carbon layer.

Next, by lithography and RIE (Reactive Ion Etching), a plurality of hole patterns are formed in the resist film 22 and the hard mask layer 21 (FIG. 2A). Next, by RIE using the resist film 22 and the hard mask layer 21 as a mask, contact holes H1, H3, H5 and H7 are formed in the stacked body (FIG. 2A).

In the step of FIG. 2A, the contact holes H1, H3, H5 and H7 are formed so as to penetrate one insulating layer 6. Numerals indicated above signs H1, H3, H5 and H7 in FIG. 2A designate the numbers of insulating layers 6 that the contact holes H1, H3, H5 and H7 penetrate.

Figure 2B:
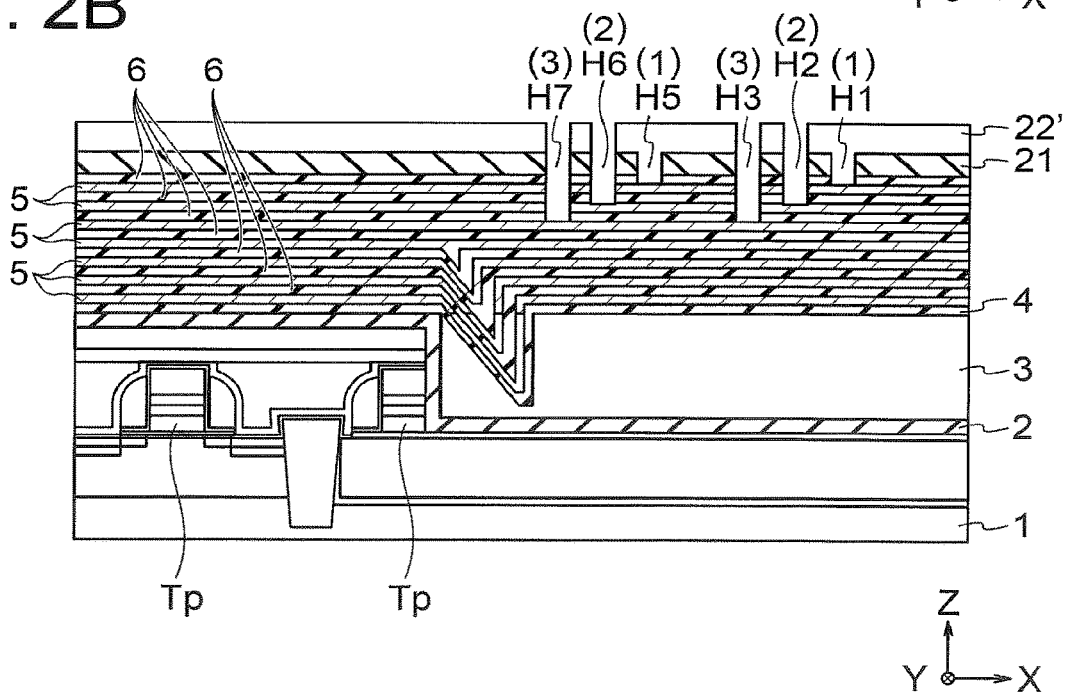

Next, after removing the resist film 22, a resist film 22' is formed on the hard mask layer 21 (FIG. 2B). Next, by lithography and RIE, a plurality of hole patterns are formed in the resist film 22' and the hard mask layer 21 (FIG. 2B). Next, by RIE using the resist film 22' and the hard mask layer 21 as a mask, contact holes H2 and H6 are formed in the stacked body, and the contact holes H3 and H7 are further etched (FIG. 2B).

In the step of FIG. 2B, the contact holes H2 and H6 are formed so as to penetrate two insulating layers 6, and the contact holes H3 and H7 are etched so as to penetrate further two insulating layers 6. As a result, the numbers of insulating layers 6 that the contact holes H1, H2, H3, H5, H6 and H7 penetrate are 1, 2, 3, 1, 2 and 3, respectively.

Figure 3A:
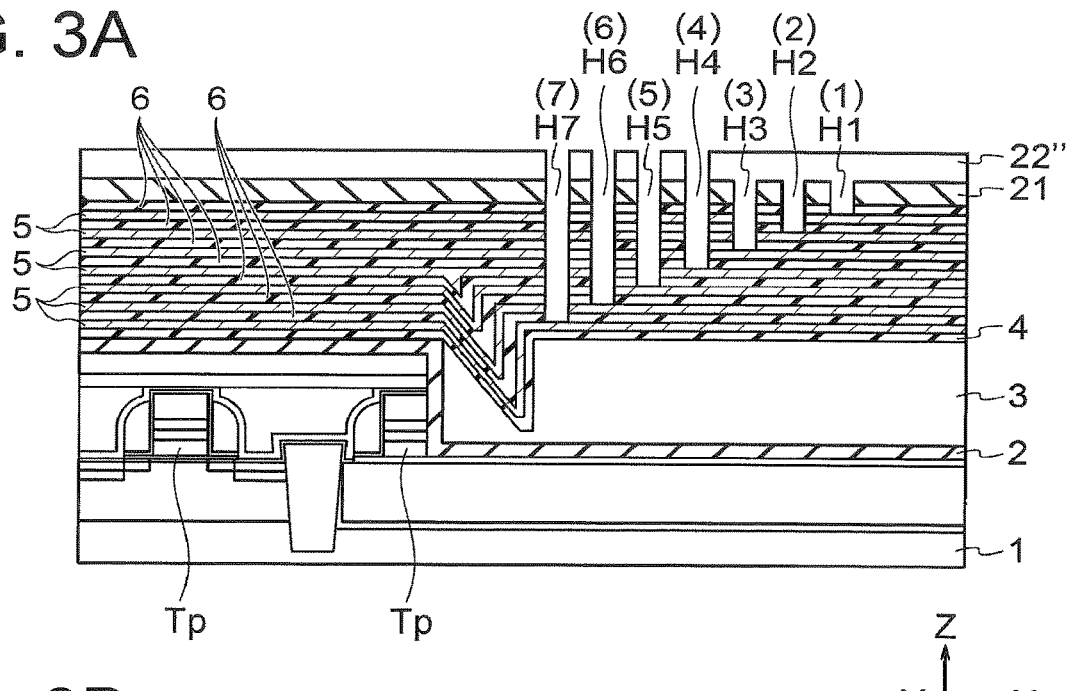

Next, after removing the resist film 22', a resist film 22" is formed on the hard mask layer 21 (FIG. 3A). Next, by lithography and RIE, a plurality of hole patterns are formed in the resist film 22" and the hard mask layer 21 (FIG. 3A). Next, by RIE using the resist film 22" and the hard mask layer 21 as a mask, a contact hole H4 is formed in the stacked body, and the contact holes H5, H6 and H7 are further etched (FIG. 3A).

In the step of FIG. 3A, the contact hole H4 is formed so as to penetrate four insulating layers 6, and the contact holes H5, H6 and H7 are etched so as to penetrate further four insulating layers 6. As a result, the numbers of insulating layers 6 that the contact holes H1, H2, H3, H4, H5, H6 and H7 penetrate are 1, 2, 3, 4, 5, 6 and 7, respectively.

Figure 3B:
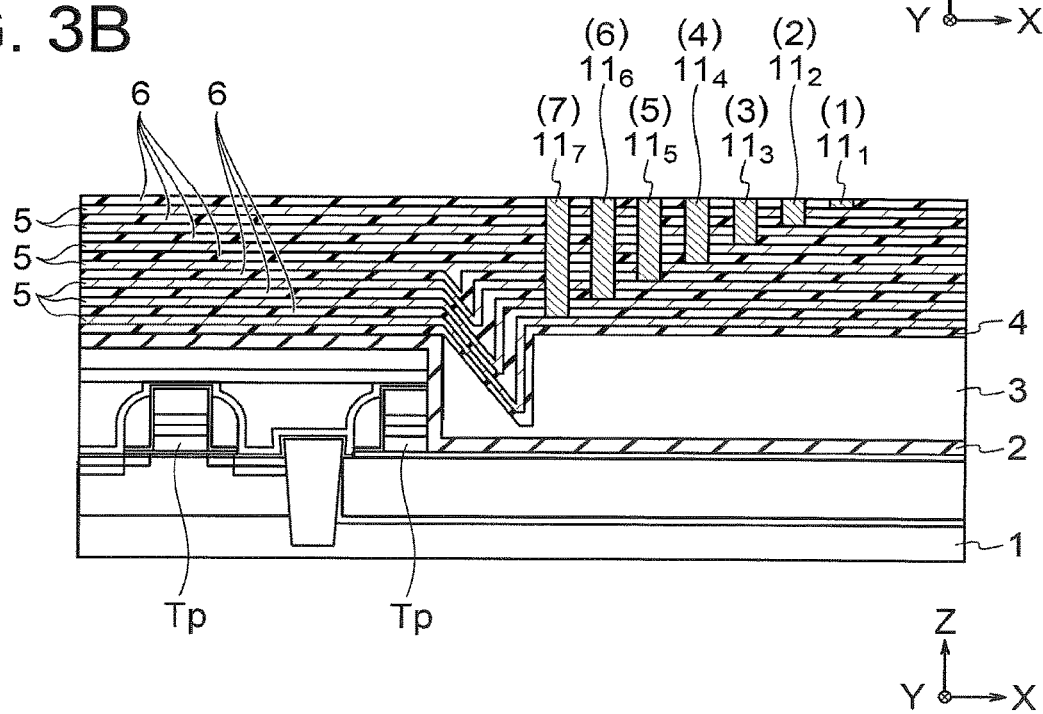

Next, after removing the resist film 22" and the hard mask layer 21, as the aforementioned contact plugs 11, contact plugs $11_1$ to $11_7$ are formed in the contact holes H1 to H7 (FIG. 3B). As above, the contact plugs $11_1$ to $11_7$ electrically connected to the electrode layers 5 different from one another are formed.

The contact hole H3 penetrates three insulating layers 6. This numeral, 3, is expressed as "011" in binary notation. Meanwhile, the contact hole H6 penetrates six insulating layers 6. This numeral, 6, is expressed as "110" in binary notation. In the comparative example, the first time, the second time and the third time of lithography are performed in association with the first digit, the second digit and the third digit values in binary notation, respectively.

For example, a hole pattern for the contact hole H3 is not formed in the third time of lithography, but formed in the first time and the second time of lithography. Meanwhile, a hole pattern for the contact hole H6 is not formed in the first time of lithography, but formed in the second time and the third time of lithography. Further, RIE is performed so as to result in penetrations of 1 ($=2^0$), 2 ($=2^1$) and 4 ($=2^2$) insulating layer(s) 5 after the first time, the second time and the third time of lithography, respectively. As a result, three times of lithography (resist formations) can form the contact holes H1 to H7 with 7 ($=2^3-1$) kinds of depths.

In the stages of FIGS. 2A to 3B, in place of the electrode layers 5, sacrificial layers may be formed between the insulating layers 6. The sacrificial layer is, for example, a silicon nitride film. In this case, the sacrificial layers are removed in the following step, and the electrode layers 5 are embedded between the insulating layers 6. The same holds true for FIGS. 4A to 23H mentioned later. The sacrificial layers are also exemplarily the second films.

As above, in the comparative example, hole processing is performed using binary notation. On the other hand, in the embodiment, hole processing is performed using N-ary notation (N is an integer of three or more). In the embodiment, two times of resist formations form contact holes with $N^2$ kinds of depths. Hereafter, as to the hole processing of the embodiment, its outline will be described with reference to FIGS. 4A to 6B, and after that, its details will be described with reference to FIGS. 7A to 23H.

FIGS. 4A to 5C are cross-sectional views showing an outline of a method of manufacturing the semiconductor device of the first embodiment.

Figure 4A:
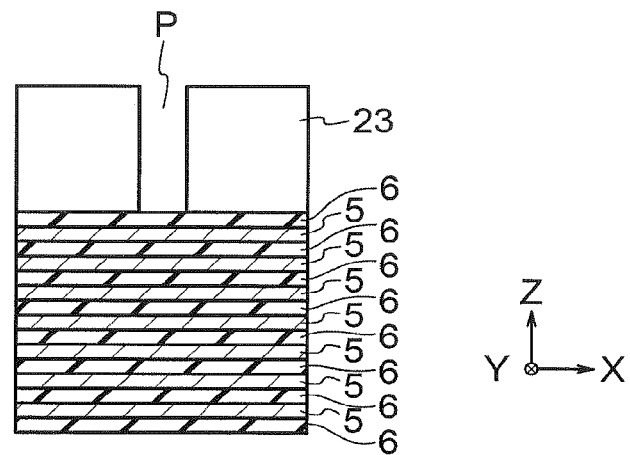
FIGS. 4A to 5C are cross-sectional views showing an outline of a method of manufacturing the semiconductor device of the first embodiment.

First, similarly to the step of FIG. 2A, a stacked body of the electrode layers 5 and the insulating layers 6 is formed (FIG. 4A). The substrate 1 and the other configurations are omitted from the figure for convenience of drawing. Next, in an upper part on the stacked body, a resist film 23 is formed in place of the hard mask layer 21 and the resist film 22 (FIG. 4A). Next, by lithography, a hole pattern P is formed in the resist film 23 (FIG. 4A).

Figure 4B:
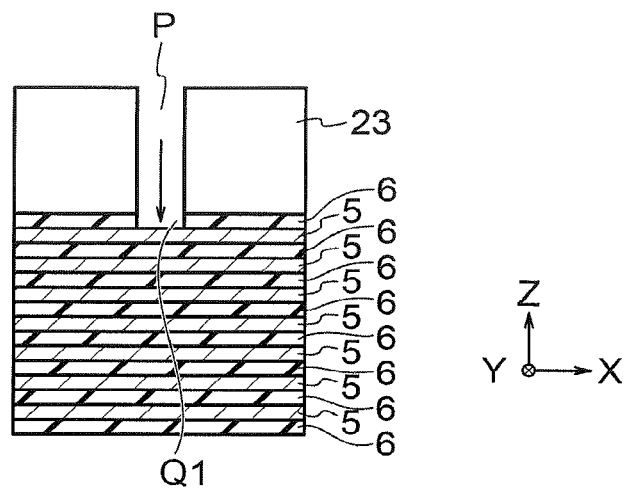

Next, by RIE using the resist film 23, a hole corresponding to the hole pattern P is formed in the stacked body (FIG. 4B). Specifically, a first hole Q1 is formed in the stacked body. The first hole Q1 is formed so as to penetrate one insulating layer 6.

Figure 4C:
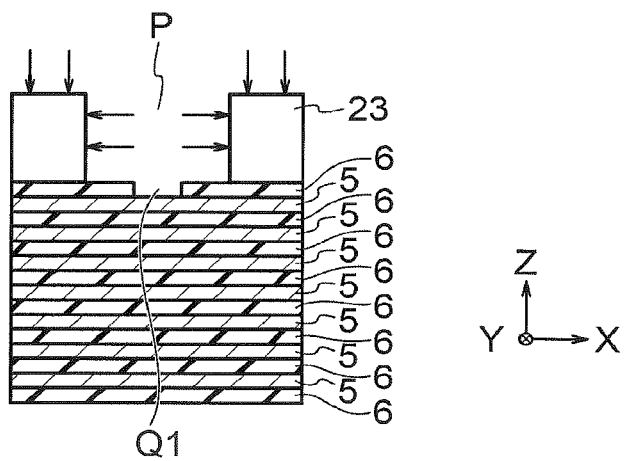
Figure 5A:
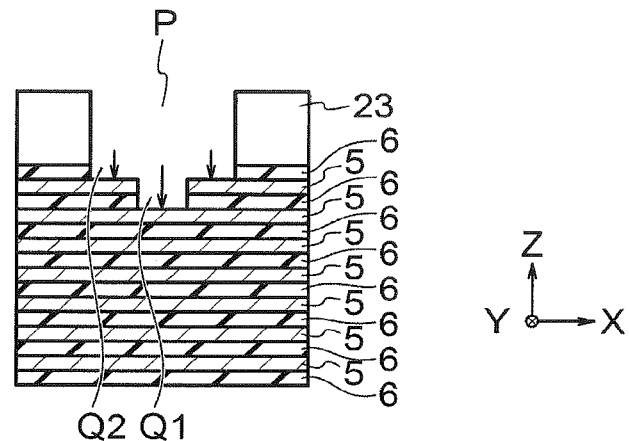

Next, the resist film 23 is slimmed, and the hole pattern P is expanded (FIG. 4C). Next, by RIE using the resist film 23, a hole corresponding to this hole pattern P is formed in the stacked body (FIG. 5A). Specifically, a second hole Q2 is formed in the stacked body, and the first hole Q1 is further etched. The second hole Q2 is formed so as to penetrate one insulating layer 6, and the first hole Q1 is etched so as to penetrate further one insulating layer 6.

Figure 5B:
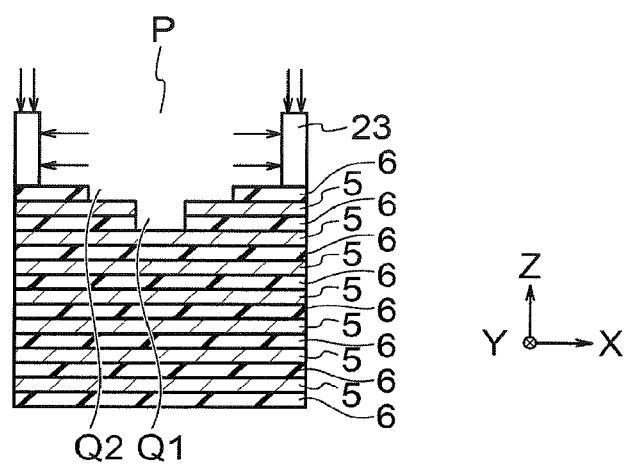

After that, the step of FIG. 4C and the step of FIG. 5A are alternately repeated. FIG. 5B shows a situation where the resist film 23 in FIG. 5A is slimmed to expand the hole pattern P.

Figure 5C:
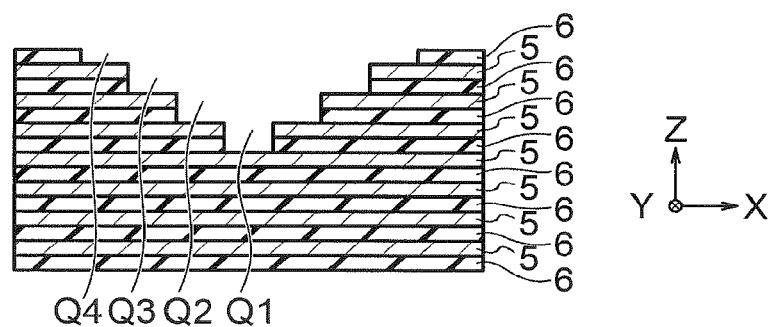

FIG. 5C shows the stacked body which has been processed through three times of slimming. The first hole Q1 penetrates four insulating layers 6, and the second hole Q2 penetrates three insulating layers 6. Furthermore, a third hole Q3 penetrates two insulating layers 6, and a fourth hole Q4 penetrates one insulating layer 6.

Here, the first to fourth holes Q1 to Q4 are joined to one another. A method for preventing such joining is described with reference to FIGS. 6A and 6B.

Figure 6A:
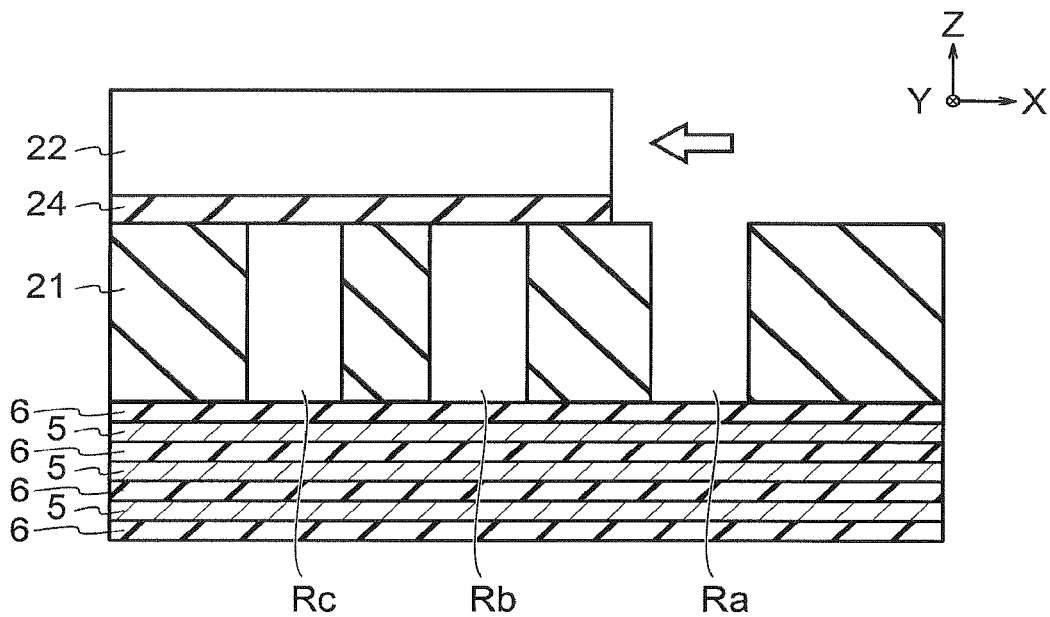
FIGS. 6A and 6B are other cross-sectional views showing the outline of the method of manufacturing the semiconductor device of the first embodiment.
Figure 6B:
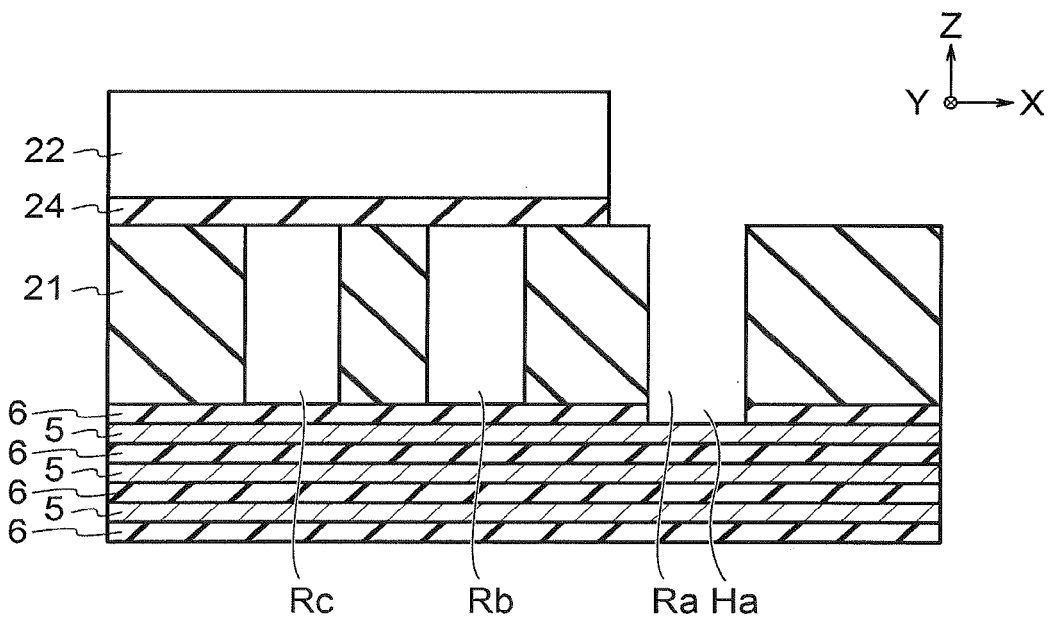
Figure 7A:
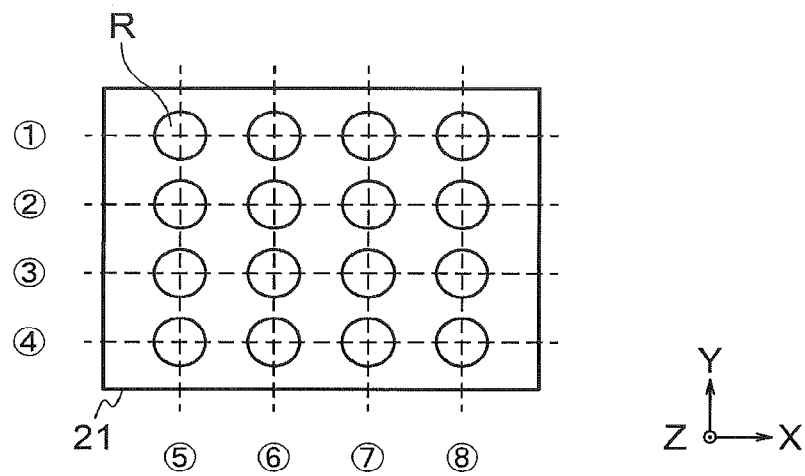
FIGS. 7A to 10C are plan views showing details of the method of manufacturing the semiconductor device of the first embodiment.
Figure 7B:
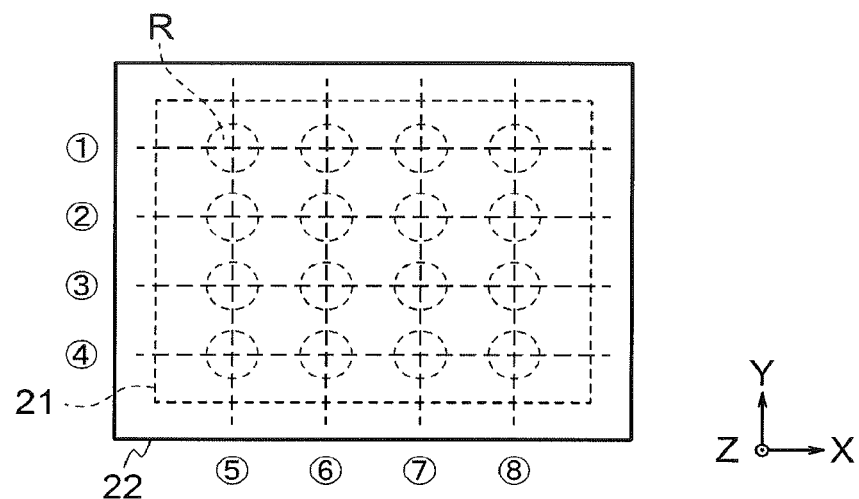
Figure 7C:
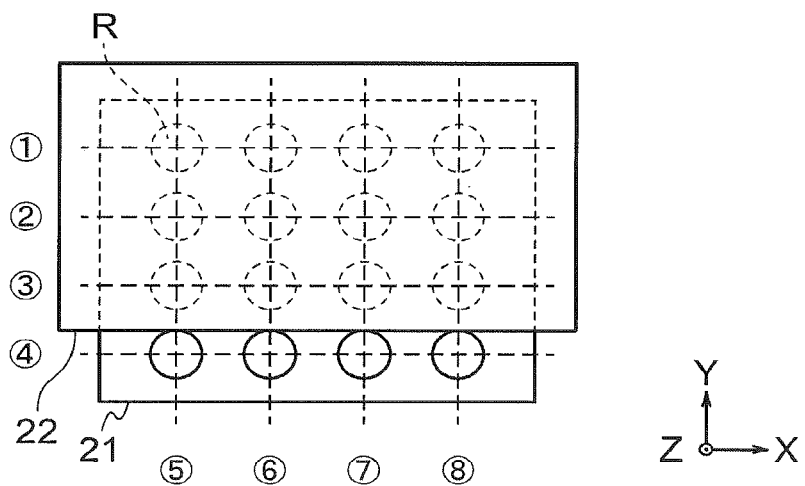
Figure 8A:
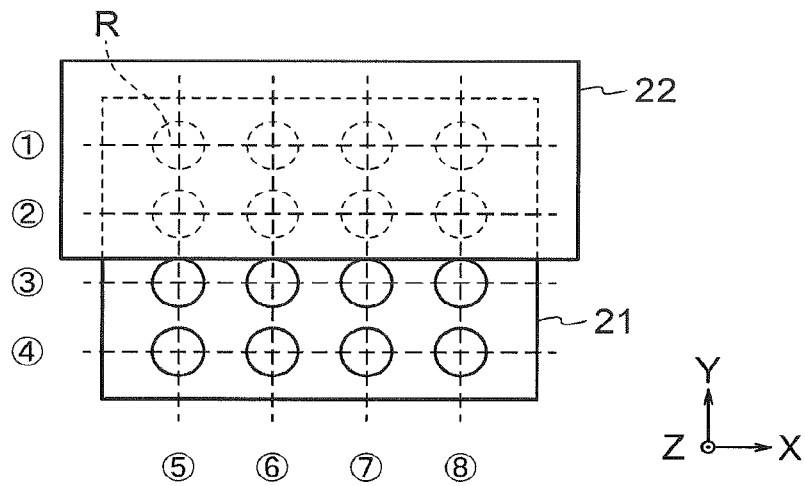
Figure 8B:
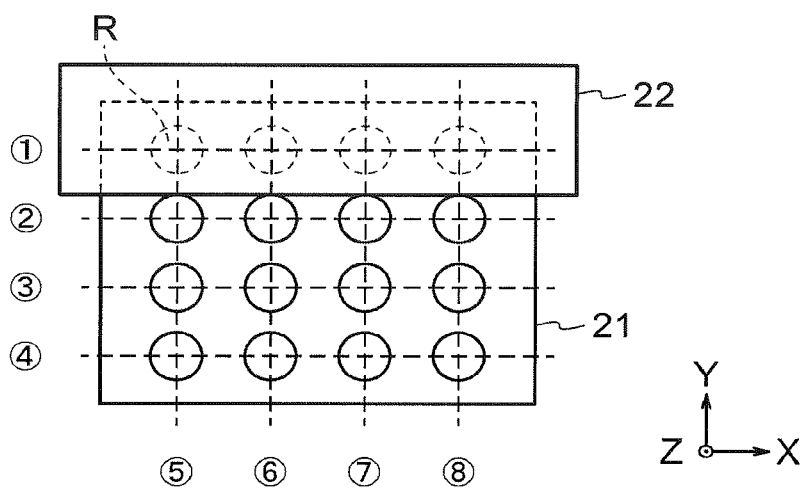
Figure 8C:
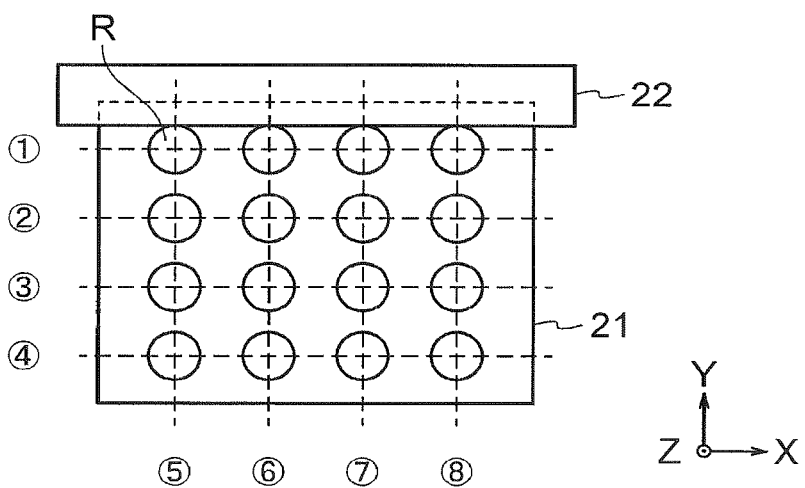
Figure 9A:
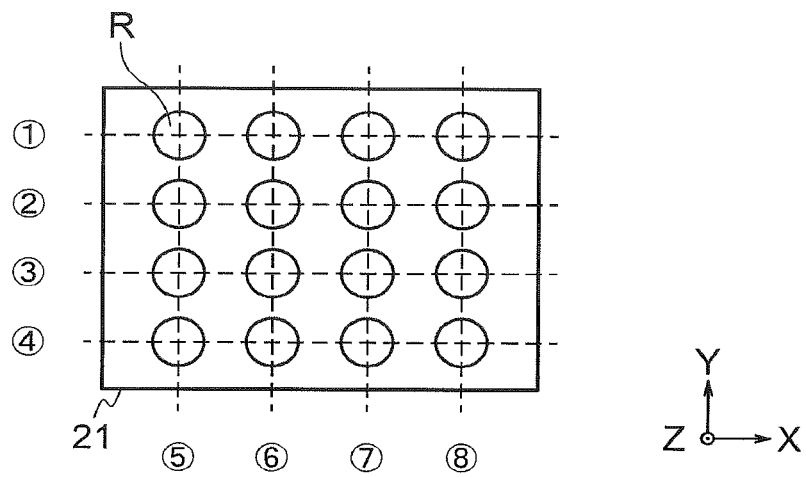
Figure 9B:
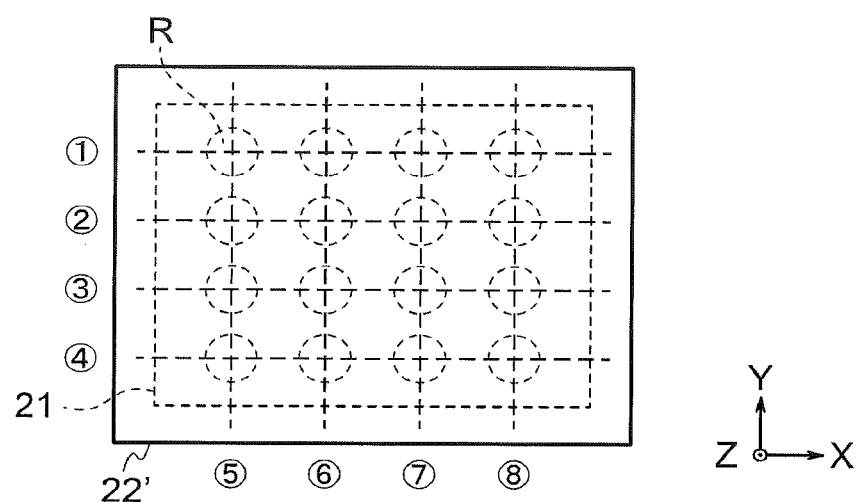
Figure 9C:
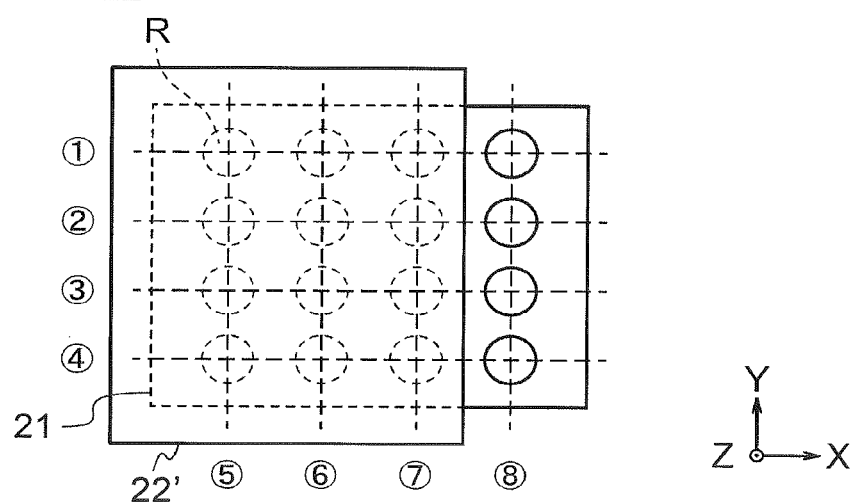
Figure 10A:
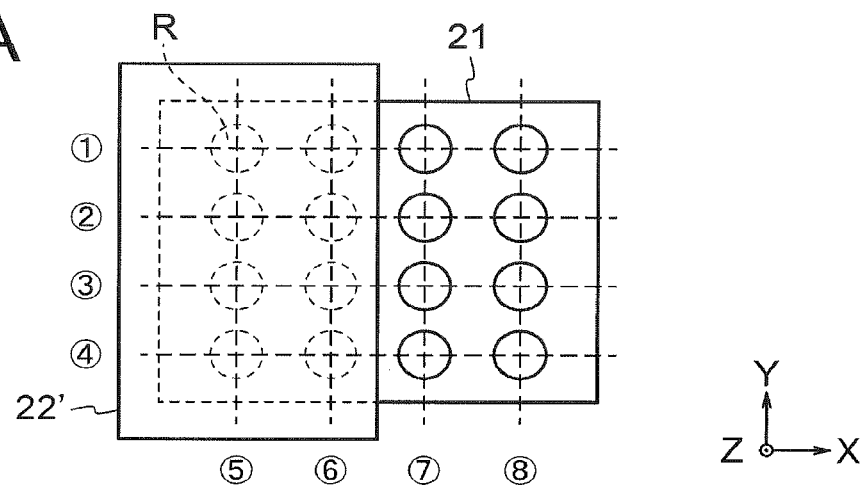
Figure 10B:
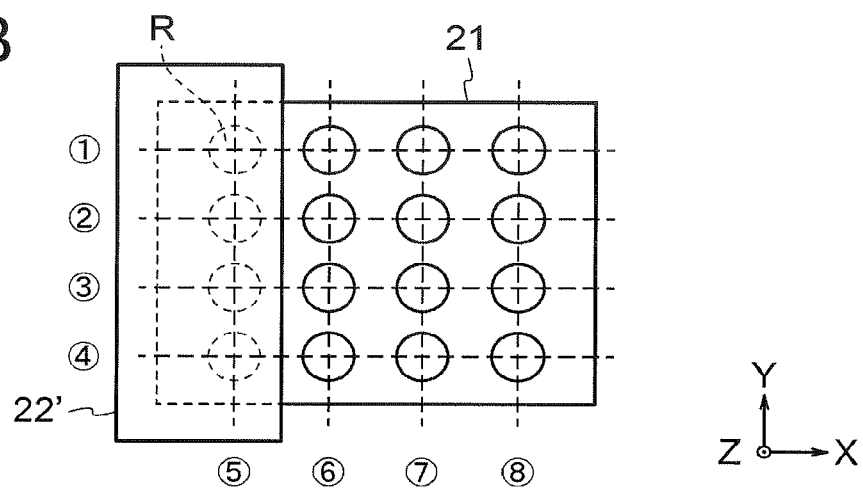
Figure 10C:
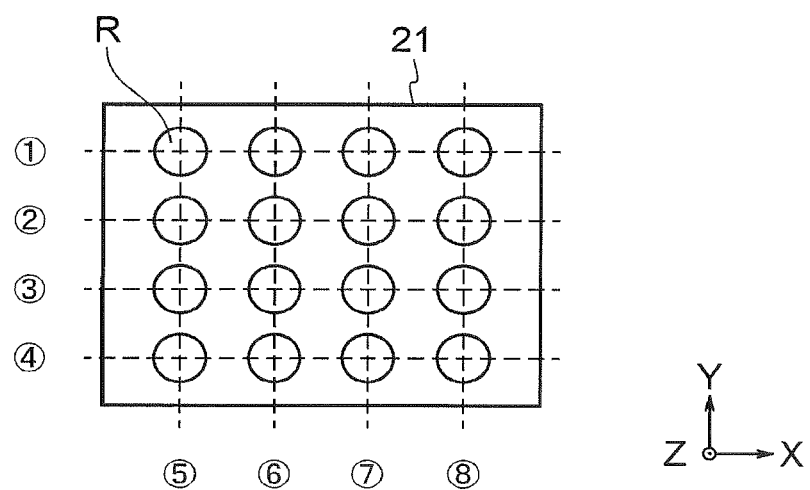
Figure 11A:
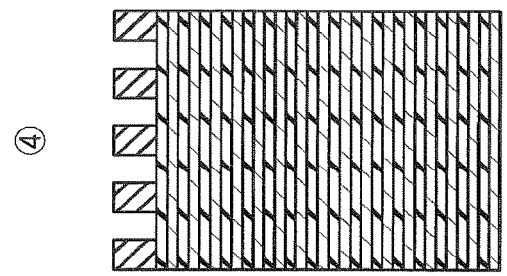
Figure 11B:
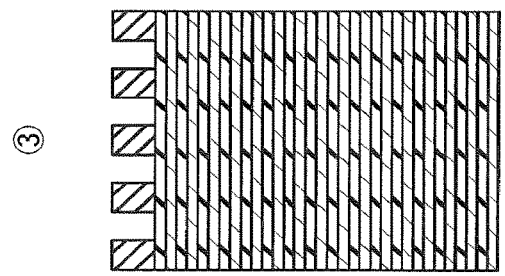
Figure 11C:
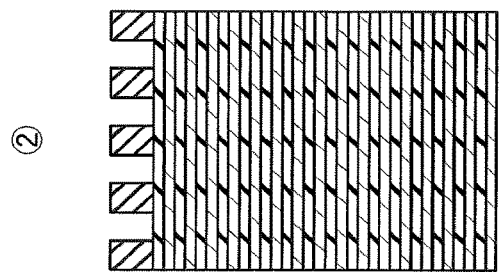
Figure 11D:
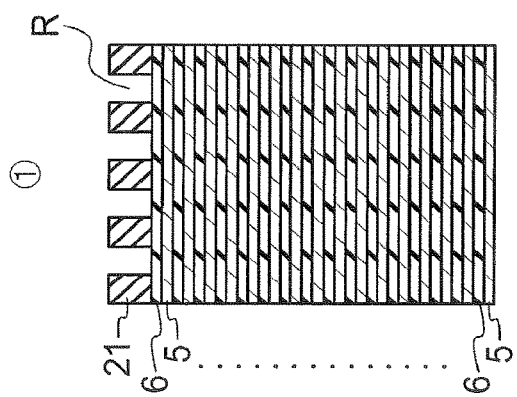
Figure 11E:
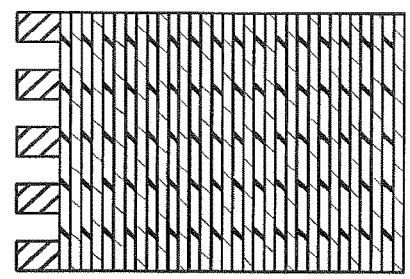
Figure 11F:
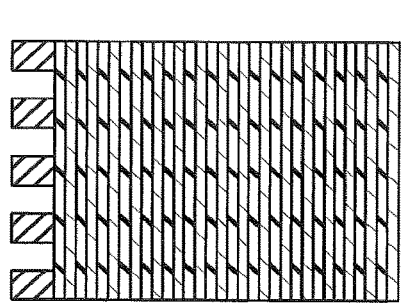
Figure 11G:
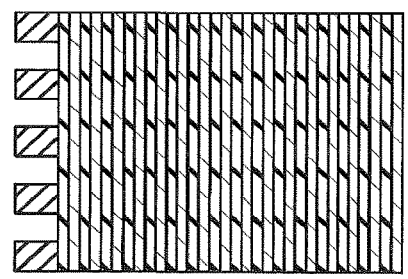
Figure 11H:
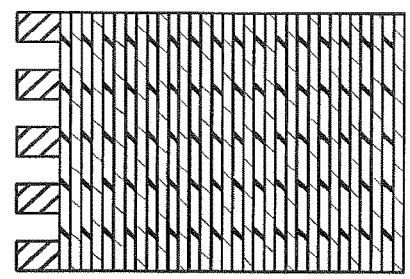
Figures 13A, 13B, 13C, 13D:
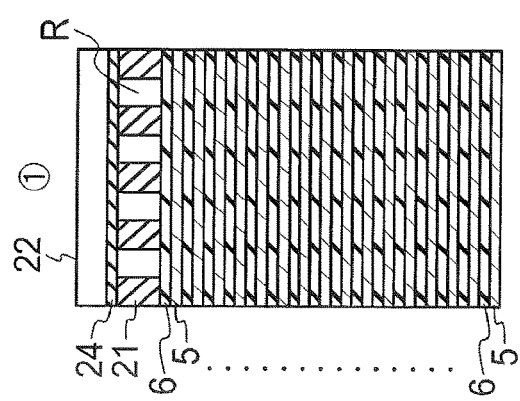
Figures 13E, 13F, 13G, 13H:
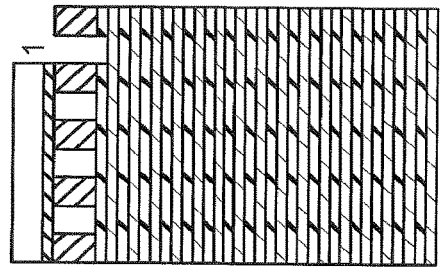
Figure 14A:
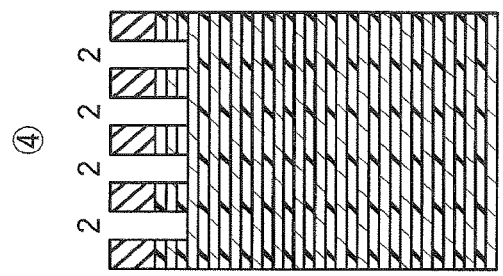
Figure 14B:
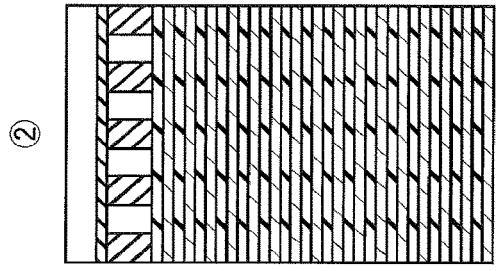
Figure 14C:
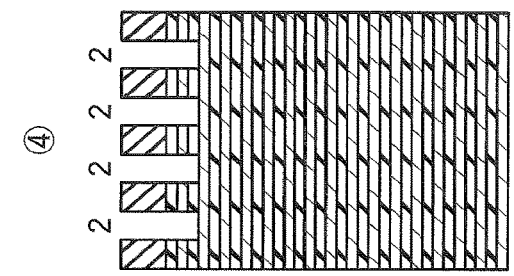
Figure 14D:
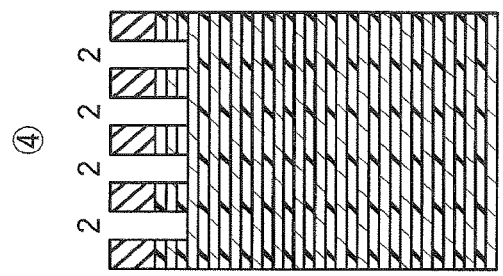
Figure 14E:
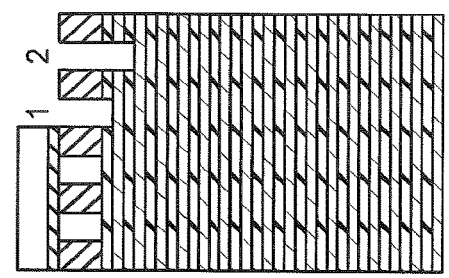
Figure 14F:
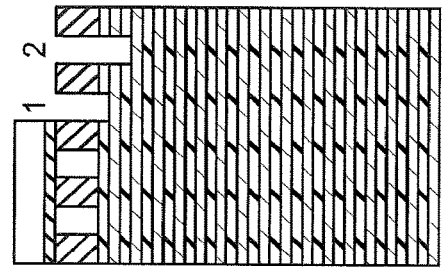
Figure 14G:
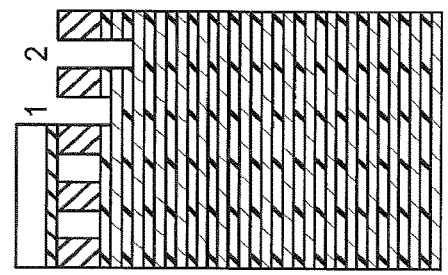
Figure 14H:
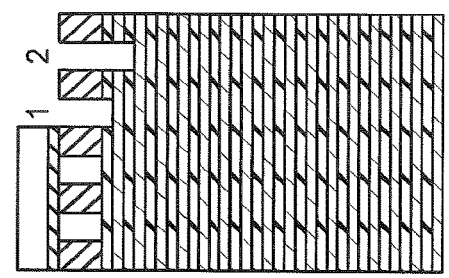
Figures 15A, 15B, 15C, 15D:
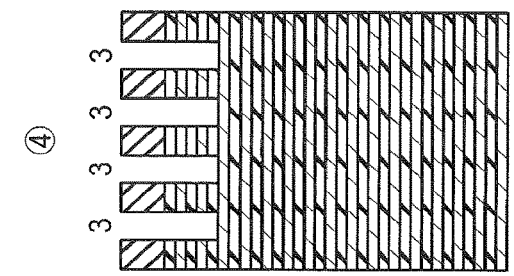
Figures 15E, 15F, 15G, 15H:
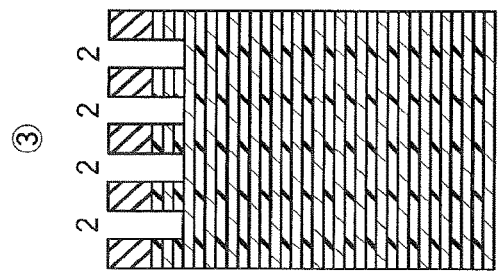
Figure 19D:
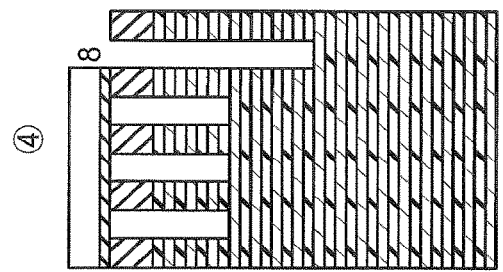
Figure 19C:
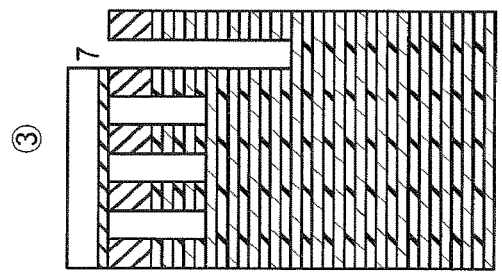
Figure 19B:
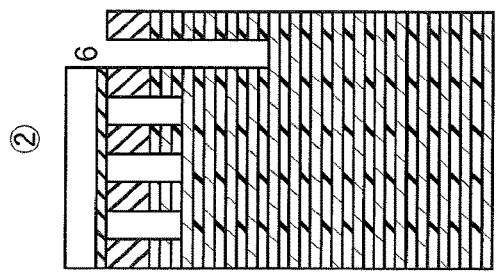
Figure 19A:
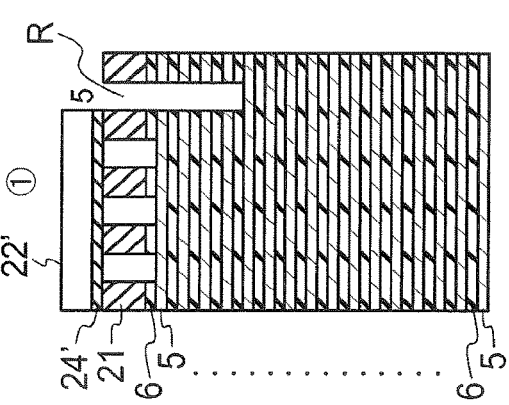
Figure 19H:
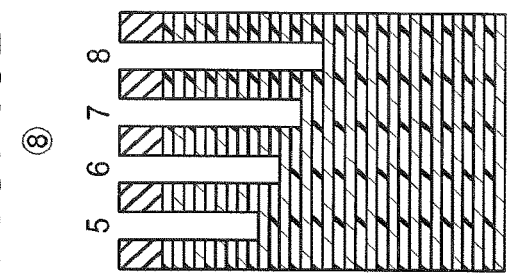
Figure 19G:
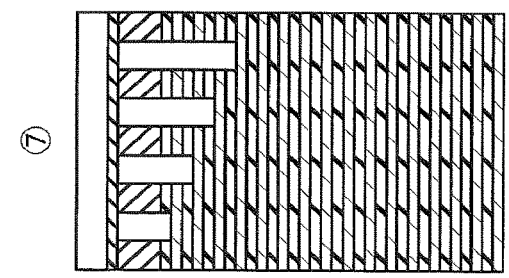
Figure 19F:
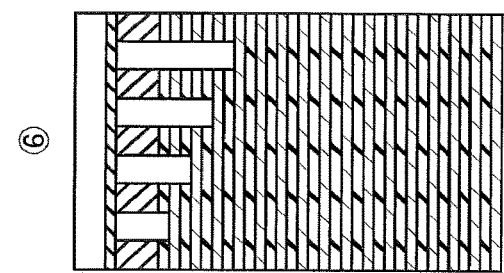
Figure 19E:
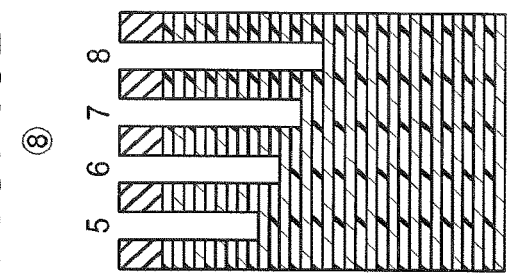
Figure 21A:
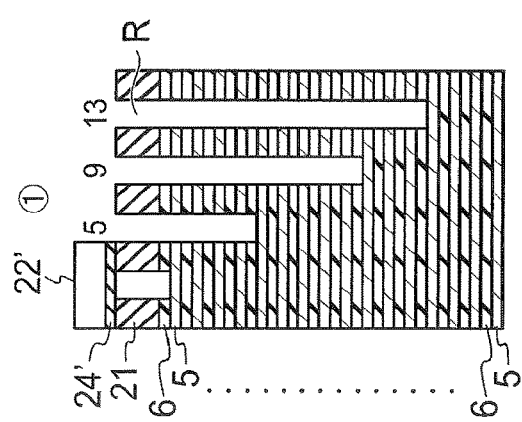
Figure 21B:
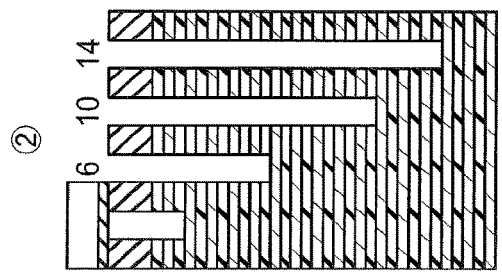
Figure 21C:
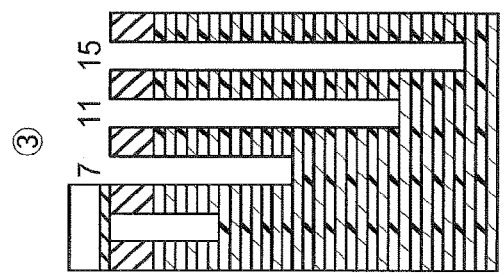
Figure 21D:
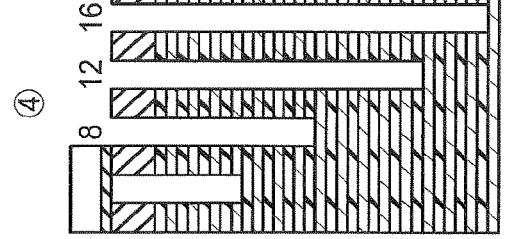
Figure 21E:
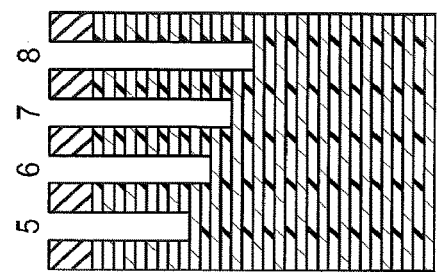
Figure 21F:
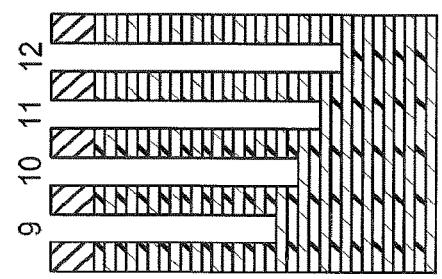
Figure 21G:
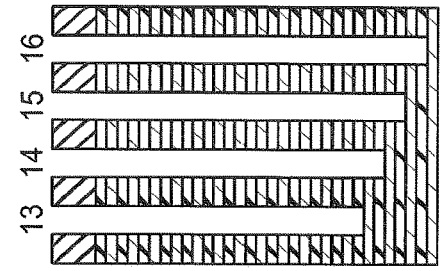
Figure 21H:
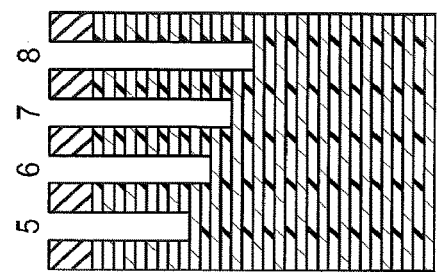

FIGS. 6A and 6B are other cross-sectional views showing the outline of the method of manufacturing the semiconductor device of the first embodiment.

First, similarly to the step of FIG. 2A, a stacked body of the electrode layers 5 and the insulating layers 6 is formed (FIG. 6A). The substrate 1 and the other configurations are omitted from the figure for convenience of drawing. Next, in an upper part on the stacked body, the hard mask layer 21 is formed, and by lithography and RIE, hole patterns Ra to Rc are formed in the hard mask layer 21 (FIG. 6A).

Next, an organic film 24 and the resist film 22 are sequentially formed on the hard mask layer 21 (FIG. 6A). As the organic film 24, various organic layers different from the resist film 22 can be employed. The organic film 24 of the embodiment is a film that is poorly embedded in the hole patterns Ra to Rc, and is formed so as to hold the hole patterns Ra to Rc hollow. Next, the resist film 22 and the organic film 24 are slimmed, and the hole pattern Ra is exposed from the resist film 22 and the organic film 24 (FIG. 6A).

Next, by RIE using the hard mask layer 21, the organic film 24 and the resist film 22, a first hole Ha corresponding to the hole pattern Ra is formed in the stacked body (FIG. 6B), The first hole Ha is formed so as to penetrate one insulating layer 6.

After that, the slimming in FIG. 6A and the RIE in FIG. 6B are alternately repeated. As a result, the first hole Ha is further etched, and a second hole corresponding to the hole pattern Rb and a third hole corresponding to the hole pattern Rc are formed in the stacked body. As above, according to this method, the holes are prevented from being joined. This method is applied to hole processing shown in FIGS. 7A to 23H.

FIGS. 7A to 10C are plan views showing details of the method of manufacturing the semiconductor device of the first embodiment. The method of manufacturing a semiconductor device of the embodiment is performed sequentially through a step of FIG. 7A to a step of FIG. 10C. In these views, four straight lines 1 to 4 extending in parallel in the X-direction and four straight lines 5 to 8 extending in parallel in the Y-direction are shown.

FIGS. 11A to 23H are cross-sectional views showing the details of the method of manufacturing the semiconductor device of the first embodiment. In these views, cross-sections taken along the straight lines 1 to 8 are shown. A step of FIGS. 11A to 11H to a step of FIGS. 22A to 22H respectively correspond to the step of FIG. 7A to the step of FIG. 10C. A step of FIGS. 23A to 23H is performed after the step of FIGS. 22A to 22H.

In the steps of FIGS. 7A to 9A, a first process is performed to form $N^2$ contact holes having N kinds (N is an integer of three or more) of depths. Furthermore, in the steps of FIGS. 9B to 10C, a second process is performed to process the $N^2$ contact holes so as to have $N^2$ kinds of depths after performing the first process.

The value of N in the embodiment is 4, and hole processing is performed using quaternary notation. Therefore, in the first process, 16 contact holes having 4 kinds of depths are formed. In the second process, the 16 contact holes are processed so as to have 16 kinds of depths.

First, similarly to the step of FIG. 2A, a stacked body of the electrode layers 5 and the insulating layers 6 is formed (FIG. 7A, FIGS. 11A to 11H). The substrate 1 and the other configurations are omitted from the figures for convenience of drawing. Next, in an upper part on the stacked body, the hard mask layer 21 is formed, and by lithography and RIE, 16 hole patterns R are formed in the hard mask layer 21. These hole patterns R are formed at positions where 16 contact holes are scheduled to be formed. Specifically, they are formed at intersections of the straight lines 1 to 8. The hard mask layer 21 is exemplarily a fifth film.

Next, the organic film 24 and the resist film 22 are sequentially formed on the hard mask layer 21 (FIG. 7B, FIGS. 12A to 12H). As the organic film 24, various organic films different from the resist film 22 can be employed. The organic film 24 of the embodiment is a film that is poorly embedded in the hole patterns R, and is formed so as to hold the hole patterns R hollow. The organic film 24 and the resist film 22 are exemplarily third films.

Next, the resist film 22 and the organic film 24 are slimmed, and the hole patterns R on the straight line 4 are exposed from the resist film 22 and the organic film 24 (FIG. 7C, FIGS. 13A to 13H). Next, by RIE using the hard mask layer 21, the organic film 24 and the resist film 22, contact holes corresponding to these hole patterns R are newly formed in the stacked body. These contact holes are formed so as to penetrate one insulating layer 6. Numerals "1" shown in FIG. 13D and the like mean this.

Next, the resist film 22 and the organic film 24 are slimmed, and furthermore, the hole patterns R on the straight line 3 are exposed from the resist film 22 and the organic film 24 (FIG. 8A, FIGS. 14A to 14H). Next, by RIE using the hard mask layer 21, the organic film 24 and the resist film 22, contact holes corresponding to these hole patterns R are newly formed in the stacked body. These contact holes are formed so as to penetrate one insulating layer 6. This RIE also acts on the contact hole on the straight line 4. As a result, the contact holes on the straight line 4 are etched so as to penetrate totally two insulating layers 6. Numerals "2" shown in FIG. 14D and the like mean this. (Similarly, other numerals than 2 shown in the same figure and other figures in the same manner also means the number of insulating layers subjected to etching so that the same number of insulating layers are penetrated.)

Next, the resist film 22 and the organic film 24 are slimmed, and furthermore, the hole patterns R on the straight line 2 are exposed from the resist film 22 and the organic film 24 (FIG. 8B, FIGS. 15A to 15H). Next, by RIE using the hard mask layer 21, the organic film 24 and the resist film 22, contact holes corresponding to these hole patterns R are newly formed in the stacked body. These contact holes are formed so as to penetrate one insulating layer 6. Moreover, the contact holes on the straight line 3 are etched so as to penetrate totally two insulating layers 6. The contact holes on the straight line 4 are etched so as to penetrate totally three insulating layers 6.

Next, the resist film 22 and the organic film 24 are slimmed, and furthermore, the hole patterns R on the straight line 1 are exposed from the resist film 22 and the organic film 24 (FIG. 8C, FIGS. 16A to 16H). Next, by RIE using the hard mask layer 21, the organic film 24 and the resist film 22, contact holes corresponding to these hole patterns R are newly formed in the stacked body. These contact holes are formed so as to penetrate one insulating layer 6. Moreover, the contact holes on the straight line 2 are etched so as to penetrate totally two insulating layers 6. The contact holes on the straight line 3 are etched so as to penetrate totally three insulating layers 6. The contact holes on the straight line 4 are etched so as to penetrate totally four insulating layers 6.

Next, the organic film 24 and the resist film 22 are removed from the stacked body (FIG. 9A, FIGS. 17A to 17H).

As above, in the first process, 16 contact holes having 4 kinds of depths are formed. Specifically, 4 contact holes having a first depth are formed on the straight line 1, and 4 contact holes having a second depth are formed on the straight line 2. Moreover, 4 contact holes having a third depth are formed on the straight line 3, and 4 contact holes having a fourth depth are formed on the straight line 4. Herein, an Xth depth (X is an integer from 1 to 4) is a depth of penetration of X insulating layer(s) 6.

Expressing this in view of the straight lines 5 to 8, 4 contact holes having the first to fourth depths are formed on each straight line of the straight lines 5 to 8. In the first process, four times of slimming form contact holes with 4 kinds of depths on each straight line of the straight lines 5 to 8. The straight lines 5 to 8 are exemplarily first to Nth straight lines.

Next, an organic film 24' and the resist film 22' are sequentially formed on the hard mask layer 21 (FIG. 9B, FIGS. 18A to 18H). As the organic film 24', various organic films different from the resist film 22' can be employed. The organic film 24' of the embodiment is a film that is poorly embedded in the hole patterns R, and is formed so as to hold the hole patterns R hollow. The organic film 24' and the resist film 22' are exemplarily fourth films. The organic film 24' and the resist film 22' of the embodiment are formed of the same materials as those of the organic film 24 and the resist film 22, respectively.

Next, the resist film 22' and the organic film 24' are slimmed, and the hole patterns R on the straight line 8 are exposed from the resist film 22' and the organic film 24' (FIG. 9C, FIGS. 19A to 19H). Next, by RIE using the hard mask layer 21, the organic film 24' and the resist film 22', the contact holes corresponding to these hole patterns R are further etched. These contact holes are etched so as to penetrate further four insulating layers 6. Numerals "5 to 8" shown in FIG. 19H mean this.

Next, the resist film 22' and the organic film 24' are slimmed, and furthermore, the hole patterns R on the straight line 7 are exposed from the resist film 22' and the organic film 24' (FIG. 10A, FIGS. 20A to 20H). Next, by RIE using the hard mask layer 21, the organic film 24' and the resist film 22', the contact holes corresponding to these hole patterns R are further etched. These contact holes are etched so as to penetrate further four insulating layers 6. This RIE also acts on the contact holes on the straight line 8. As a result, the contact holes on the straight line 8 are also etched so as to penetrate further four insulating layers 6. Numerals "9 to 12" shown in FIG. 20H mean this.

Next, the resist film 22' and the organic film 24' are slimmed, and furthermore, the hole patterns R on the straight line 6 are exposed from the resist film 22' and the organic film 24' (FIG. 10B, FIGS. 21A to 21H). Next, by RIE using the hard mask layer 21, the organic film 24' and the resist film 22', the contact holes corresponding to these hole patterns R are further etched. These contact holes are etched so as to penetrate further four insulating layers 6. Moreover, the contact holes on the straight line 7 and on the straight line 8 are also etched so as to penetrate further four insulating layers 6. Numerals "9 to 12" shown in FIG. 21G and numerals "13 to 16" shown in FIG. 21H mean this.

Next, the organic film 24' and the resist film 22' are removed from the stacked body (FIG. 10C, FIGS. 22A to 22H).

As above, in the second process, 16 contact holes are processed so as to have 16 kinds of depths. Specifically, the depths of the contact holes on the straight line 5 are maintained to be the first to fourth depths, and hole processing is performed such that the depths of the contact holes on the straight line 6 are changed to the fifth to eighth depths. Moreover, hole processing is performed such that the depths of the contact holes on the straight line 7 are changed to the ninth to twelfth depths, and the depths of the contact holes on the straight line 8 are changed to the thirteenth to sixteenth depths. Herein, a Yth depth (Y is an integer from 1 to 16) is a depth of penetration of Y insulating layer(s) 6.

Therefore, when the straight lines 5 to 8 are expressed as first to fourth straight lines, respectively, in the second process, the contact holes on the Xth straight line are processed so as to penetrate further 4×(X−1) insulating layers 6. Specifically, the contact holes on the straight line 6 are processed so as to penetrate further 4 insulating layers 6. Moreover, the contact holes on the straight line 7 are processed so as to penetrate further 8 insulating layers 6. Moreover, the contact holes on the straight line 8 are processed so as to penetrate further 12 insulating layers 6. In the second process, three times of slimming form the contact holes with 16 kinds of depths in the stacked body.

Next, the contact plugs 11 are formed in these contact holes (FIGS. 23A to 23H). As above, the contact plugs 11 which have 16 kinds of depths (thicknesses) and are electrically connected to the electrode layers 5 different from one another are formed.

These contact plugs 11 are adjacent to one another in the X-direction and the Y-direction, and have first to sixteenth depths. Here, the first to sixteenth depths are depths of penetrations of 1 to 16 insulating layer(s) 6, respectively. The Y-direction is exemplarily a first direction, and the X-direction is exemplarily a second direction.

The contact plugs 11 adjacent to each other in the Y-direction have an αth depth and an (α+1)th depth (any of α and α+1 is an integer from 1 to 16). Therefore, a difference between the depths of the contact plugs 11 adjacent to each other in the Y-direction is 1. For example, in FIG. 23H, differences between the depths of the contact plugs 11 adjacent to each another in the Y-direction are "14−13", "15−14" and "16−15", any of which is 1.

The contact plugs 11 adjacent to each other in the X-direction has a βth depth and a (β+4)th depth (any of β and β+4 is an integer from 1 to 16). Therefore, a difference between the depths of the contact plugs 11 adjacent to each other in the X-direction is 4. For example, in FIG. 23D, differences between the depths of the contact plugs 11 adjacent to each another in the X-direction are "8–4", "12–8" and "16–12", any of which is 4.

As above, in the embodiment, the first process of forming $N^2$ contact holes having N kinds (N is an integer of three or more) of depths is performed. Furthermore, after performing the first process, the second process of processing the $N^2$ contact holes so as to have $N^2$ kinds of depths is performed.

For example, when the value of N is 4, by the first process, 16 contact holes having 4 kinds of depths are formed. By the second process, the 16 contact holes are processed so as to have 16 kinds of depths.

Accordingly, in the embodiment, two resist formations (FIG. 7B, FIG. 9B) can form contact holes with $N^2$ kinds of depths. As a result, even when contact holes with various depths are formed, these contact holes can be formed in a small number of steps, which can reduce costs and labor in production of a semiconductor device. Therefore, according to the embodiment, contact holes and contact plugs 11 having a plurality of depths can be efficiently formed.

The value of N may be other than 4 as long as it is of three or more. Moreover, the configuration and the method of the embodiment can also be applied to holes other than the contact holes.

Second Embodiment

Figure 24:
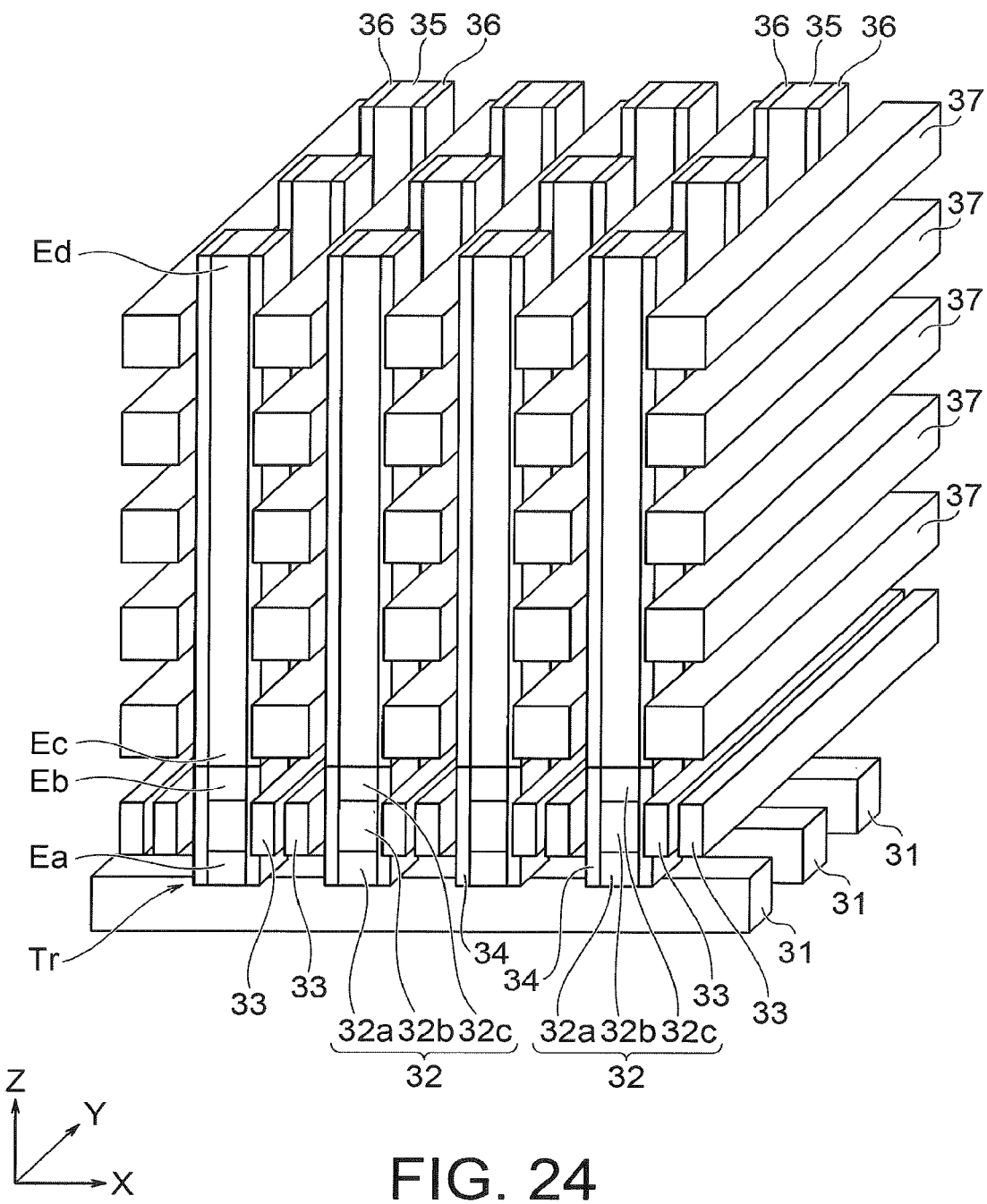
FIG. 24 is a perspective view showing a structure of a semiconductor device of a second embodiment.

FIG. 24 is a perspective view showing a structure of a semiconductor device of a second embodiment. The semiconductor device in FIG. 24 includes a ReRAM (Resistive Random Access Memory).

The semiconductor device in FIG. 24 includes a plurality of global bit lines 31. These global bit lines 31 may be formed, for example, of a part of a silicon substrate, or may be formed of a polysilicon layer provided on the silicon substrate via an insulator. Similarly to FIG. 1, FIG. 24 shows the X-direction and the Y-direction which are parallel to a surface of the substrate and perpendicular to each other, and the Z-direction perpendicular to the surface of the substrate. The global bit lines 31 extend in the X-direction.

A plurality of semiconductor members 32 are formed on each global bit line 31. These semiconductor members 32 are arranged into a matrix along the X-direction and the Y-direction. Signs Ea and Eb designate a lower end and an upper end of each semiconductor member 32, respectively. The lower end Ea of each semiconductor member 32 is electrically connected to one global bit line 31. Each semiconductor member 32 includes an n-type portion 32a formed on one global bit line 31, a p-type portion 32b formed on the n-type portion 32a, and an n-type portion 32c formed on the p-type portion 32b.

The semiconductor device in FIG. 24 further includes a plurality of gate electrodes 33 extending between the semiconductor members 32 in the Y-direction. Each gate electrode 33 is provided on a +X-directional lateral face or a −X-directional lateral face of an upper part of the n-type portion 32a, the entirety of the p-type portion 32b, and a lower part of the n-type portion 32c via a gate insulator 34.

Gate insulators 34 are provided on the +X-directional lateral face and the −X-directional lateral face of each semiconductor member 32. One semiconductor member 32, a pair of gate electrodes 33, and the gate insulators 34 between these constitute an n-channel TFT (Thin Film Transistor), which is designated by sign Tr.

One local bit line 35 having a pillar shape extending in the Z-direction is formed on each semiconductor member 32. Local bit lines 35 are formed, for example, of titanium nitride films. Signs Ec and Ed designate a lower end and an upper end of each local bit line 35, respectively. The lower end Ec of each local bit line 35 is electrically connected to the upper end Eb of one semiconductor member 32.

Resistance change films 36 are formed on the +X-directional lateral face and the −X-directional lateral face of each local bit line 35. The resistance change film 36 is a film whose resistance state changes depending on a supplied voltage or current.

The semiconductor device in FIG. 24 further includes a plurality of word lines 37 extending between the local bit lines 35 in the Y-direction. The plurality of word lines 37 that are adjacent to each another in the Z-direction are disposed between the local bit lines 35 adjacent to each other in the X-direction. The word lines 37 are formed, for example, of titanium nitride films. The resistance change film 36 is formed between the local bit line 35 and the word line 37.

In the embodiment, a plurality of electrode layers including these word lines 37, and a plurality of insulating layers which electrically insulate these electrode layers from one another are alternately formed on a substrate. The method of forming contact holes described for the first embodiment can also be applied to contact holes formed in these electrode layers and insulating layers. In this case, the insulating layers are exemplarily the first films, and the electrode layers are exemplarily the second films.

According to the embodiment, holes and plugs in a ReRAM can be efficiently formed.

Third Embodiment

FIGS. 25 to 28 are plan views showing details of a method of manufacturing a semiconductor device of a third embodiment.

In the embodiment, after performing the steps of FIGS. 10C and 22A to 22H, steps of FIGS. 25 to 28 (third process) are performed in place of the step of FIGS. 23A to 23H.

Figure 25:
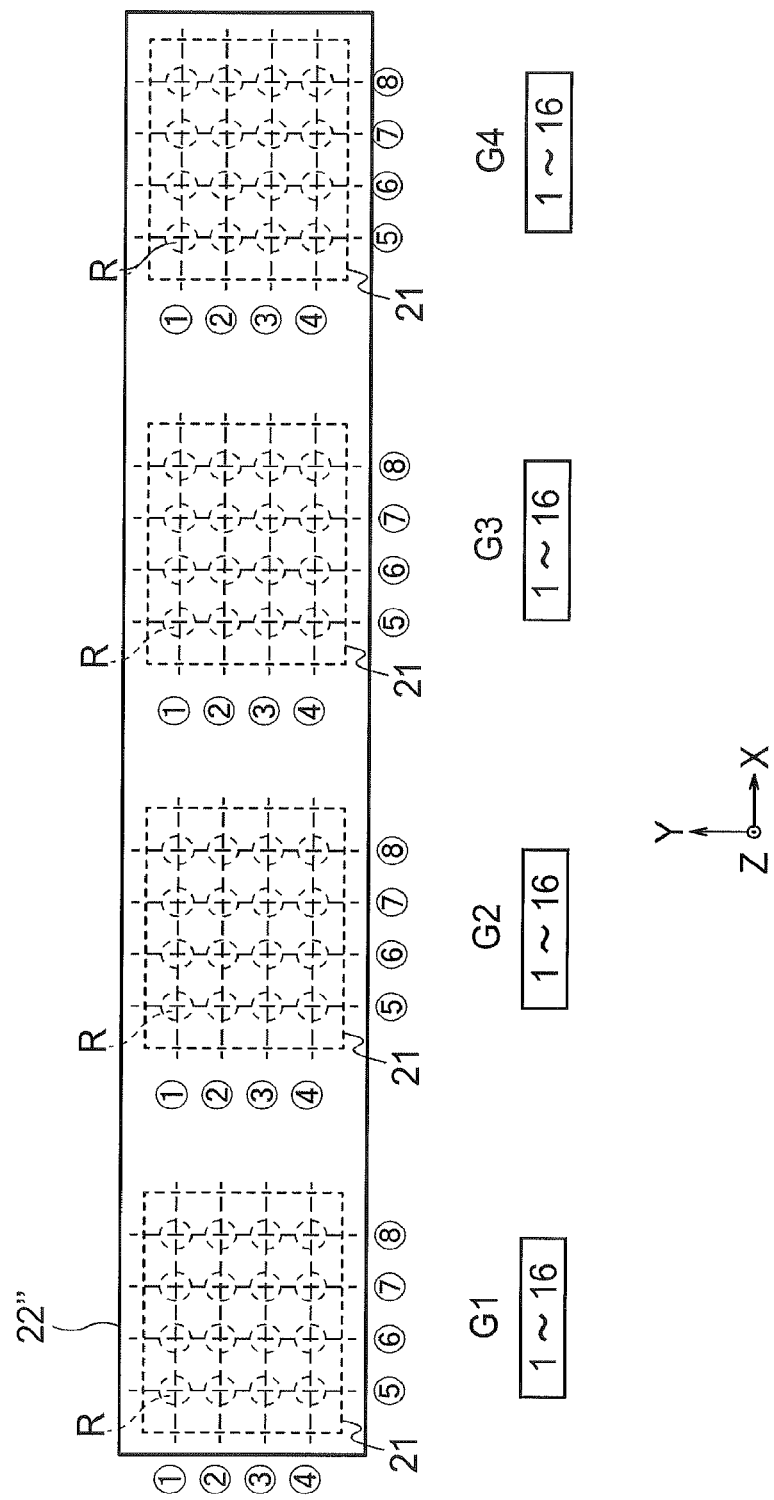
FIGS. 25 to 28 are plan views showing details of a method of manufacturing a semiconductor device of a third embodiment.

FIG. 25 shows N (herein, 4) hole groups formed in a stacked body of the electrode layers 5 and the insulating layers 6, and specifically, shows first to fourth hole groups G1 to G4. Each hole group is constituted of 16 contact holes having first to sixteenth depths. In the embodiment, 4 groups of the 16 contact holes having the first to sixteenth depths are formed in the steps of FIGS. 7A to 10C (namely, the steps of FIGS. 11A to 22H).

In the embodiment, first, an organic film 24" (not shown) and a resist film 22" are sequentially formed on the hard mask 21 (FIG. 25). The organic film 24" and the resist film 22" of the embodiment are formed of the same materials as those of the organic film 24 and the resist film 22, respectively. The organic film 24" and the resist film 22" are exemplarily sixth films.

Figure 26:
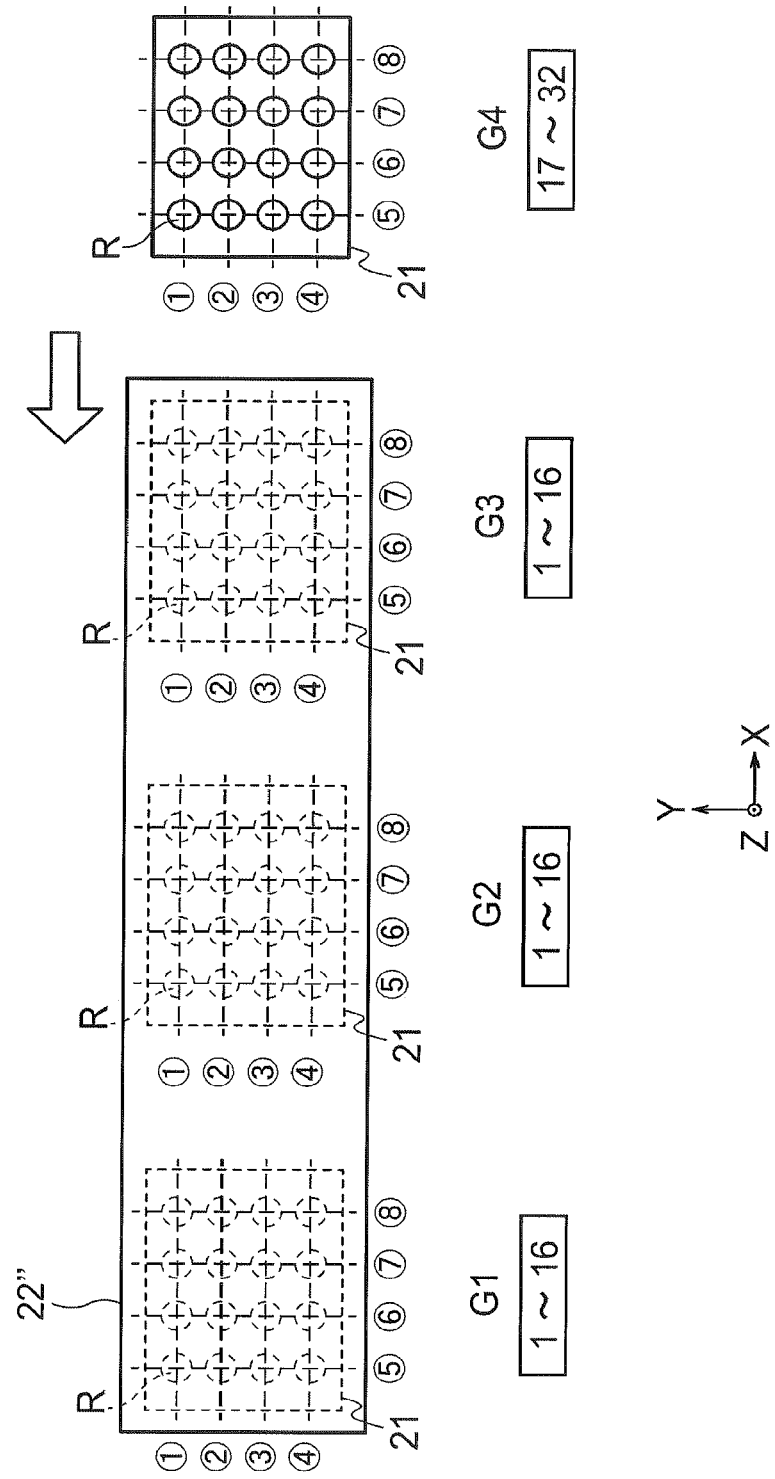

Next, the resist film 22" and the organic film 24" are slimmed, and the hole patterns R of the fourth hole group G4 are exposed from the resist film 22" and the organic film 24" (FIG. 26). Next, by RIE using the hard mask layer 21, the resist film 22" and the organic film 24", 16 contact holes corresponding to these hole patterns R are etched. These contact holes are etched so as to penetrate further 16 insulating layers 6. Numerals "17 to 32" indicated for the fourth hole group G4 mean this.

Figure 27:
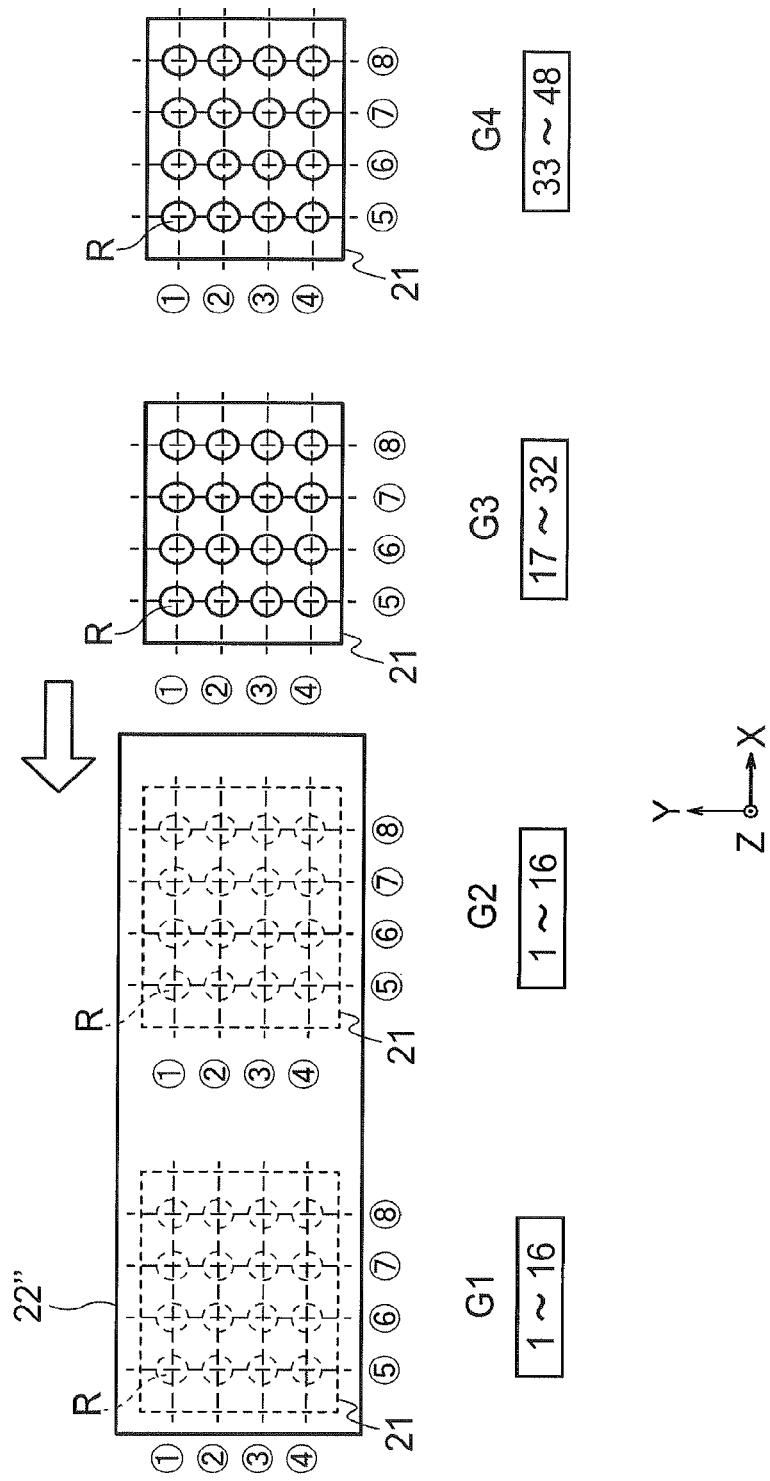

Next, the resist film 22" and the organic film 24" are slimmed, and furthermore, the hole patterns R of the third hole group G3 are exposed from the resist film 22" and the organic film 24" (FIG. 27). Next, by RIE using the hard mask layer 21, the resist film 22" and the organic film 24", 32 contact holes corresponding to these hole patterns R are further etched. These contact holes are etched so as to penetrate further 16 insulating layers 6. Numerals "33 to 48" indicated for the fourth hole group G4 and numerals "17 to 32" indicated for the third hole group G3 mean this.

Figure 28:
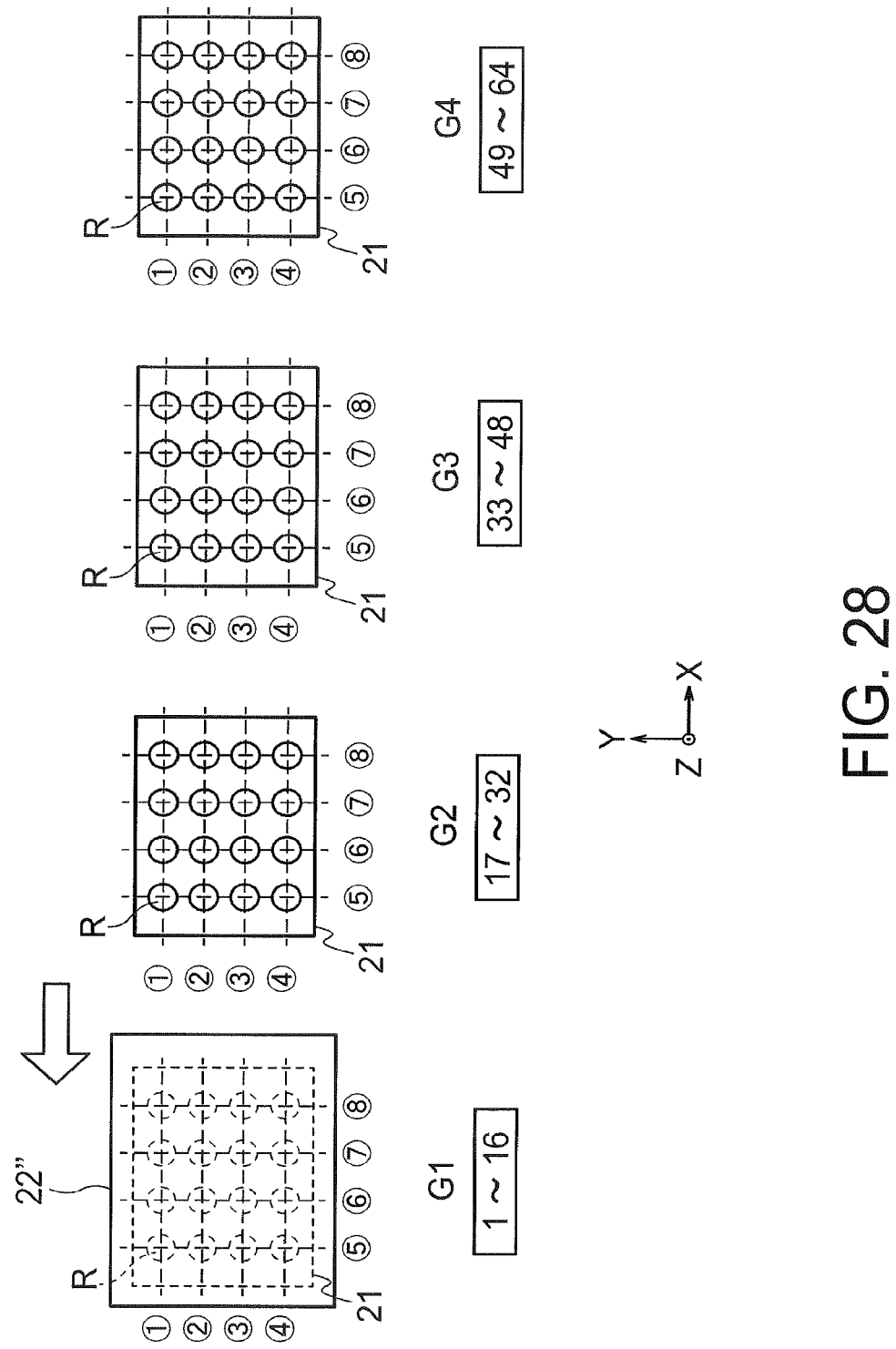

Next, the resist film 22" and the organic film 24" are slimmed, and furthermore, the hole patterns R of the second hole group G2 are exposed from the resist film 22" and the organic film 24" (FIG. 28). Next, by RIE using the hard mask layer 21, the resist film 22" and the organic film 24", 48 contact holes corresponding to the hole patterns R are further etched. These contact holes are etched so as to penetrate further 16 insulating layers 6. Numerals "49 to 64" indicated for the fourth hole group G4, numerals "33 to 48" indicated for the third hole group G3, and numerals "17 to 32" indicated for the second hole group G2 mean this.

After that, the organic film 24" and the resist film 22" are removed from the stacked body.

As above, in the steps of FIGS. 25 to 28 (third process), $N^3$ contact holes having $N^3$ kinds of depths, that is, $4^3$ (=64) contact holes having $4^3$ (=64) kinds of depths are formed in the stacked body.

In the third process, $N^2$ holes of a Zth hole group (Z is an integer from 1 to N) are processed so as to penetrate further $N^2 \times (Z-1)$ insulating layers 6. For example, the 16 holes of the fourth hole group G4 are processed so as to penetrate further 48 insulating layers 6. This is like the illustrations for the steps of FIG. 26, FIG. 27 and FIG. 28.

In the embodiment, in FIG. 25, first to $(N^{K-2})$th (K is an integer of three or more) hole groups may be prepared in the stacked body. In this case, (K−2) times of repetitions of the steps in FIGS. 25 to 28 can form $N^K$ contact holes having $N^K$ kinds of depths in the stacked body. For example, when K=4, from first to $(4^2)$th hole groups, $4^4$ contact holes having $4^4$ kinds of depths can be formed in the stacked body.

In the third process in this case, $N^2$ holes of the Zth hole group (Z is an integer from 1 to $N^{K-2}$) are to be processed so as to penetrate further $N^2 \times (Z-1)$ insulating layers 6.

As above, according to the embodiment, $N^{K-2}$ groups of $N^2$ contact holes having $N^2$ kinds of depths are formed, and thereby, $N^K$ contact holes having $N^K$ kinds of depths can be formed.

The step of FIGS. 23A to 23H in the first embodiment can also be applied to the embodiment. Thereby, $N^K$ contact plugs 11 having $N^K$ kinds of depths can be formed. Moreover, the method of the embodiment can also be applied to the ReRAM of the second embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a stacked body including a plurality of first films and a plurality of second films that are alternately provided on a substrate in a first direction; and
$N^2$ plugs that are provided in the stacked body, are adjacent to one another in a second direction crossing with the first direction and a third direction crossing with the first and second directions, and have first to $(N^2)$th depths where N is an integer of three or more regarding the $N^2$ plugs and the $(N^2)$th depths,
wherein
a Yth depth is a depth of penetration of Y second film(s) where Y is an integer from 1 to $N^2$,
plugs adjacent to each other in the second direction have an αth depth and an (α+1)th depth,
plugs adjacent to each other in the third direction have a βth depth and a (β+N)th depth, and
any of α, α+1, β and β+N is an integer from 1 to $N^2$.

2. The semiconductor device of claim 1, wherein $N^K$ plugs that include the $N^2$ plugs are provided in the stacked body so as to have $N^K$ kinds of depths where K is an integer of three or more.

3. The semiconductor device of claim 1, wherein each of the $N^2$ plugs penetrates at least one of the plurality of first films and/or at least one of the plurality of second films.

4. The semiconductor device of claim 1, wherein the $N^2$ plugs are provided such that N plugs among the $N^2$ plugs line along the second direction.

5. The semiconductor device of claim 2, wherein the $N^K$ plugs are provided such that C×N plugs among the $N^K$ plugs line along the third direction where C is an integer of two or more.

6. The semiconductor device of claim 1, wherein N is three regarding the $N^2$ plugs and the $(N^2)$th depths.

7. The semiconductor device of claim 1, wherein N is four regarding the $N^2$ plugs and the $(N^2)$th depths.

\* \* \* \* \*